US010468434B2

(12) United States Patent
Lee et al.

(10) Patent No.: US 10,468,434 B2
(45) Date of Patent: Nov. 5, 2019

(54) HYBRID THIN FILM TRANSISTOR STRUCTURE, DISPLAY DEVICE, AND METHOD OF MAKING THE SAME

(71) Applicant: INNOLUX CORPORATION, Miao-Li County (TW)

(72) Inventors: Kuan-feng Lee, Miao-Li County (TW); Chandra Lius, Miao-Li County (TW); Nai-Fang Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/436,073

(22) Filed: Feb. 17, 2017

(65) Prior Publication Data

US 2017/0294456 A1 Oct. 12, 2017

Related U.S. Application Data

(60) Provisional application No. 62/337,384, filed on May 17, 2016, provisional application No. 62/319,965, filed on Apr. 8, 2016.

(51) Int. Cl.
*H01L 27/12* (2006.01)
*H01L 21/02* (2006.01)
(Continued)

(52) U.S. Cl.
CPC .... *H01L 27/1225* (2013.01); *H01L 21/02164* (2013.01); *H01L 21/02532* (2013.01);
(Continued)

(58) Field of Classification Search
CPC ............ H01L 27/1225; H01L 27/1229; H01L 27/1237; H01L 21/02164; H01L 21/02532;
(Continued)

(56) References Cited

U.S. PATENT DOCUMENTS

2013/0092927 A1* 4/2013 Murai ................. H01L 27/1222
257/43
2015/0076471 A1* 3/2015 Saito ................... H01L 27/3262
257/40
(Continued)

FOREIGN PATENT DOCUMENTS

TW 201521186 A 6/2015

OTHER PUBLICATIONS

Office Action dated Nov. 29, 2017 issued in corresponding Taiwan application No. 106111672.

*Primary Examiner* — Timor Karimy
(74) *Attorney, Agent, or Firm* — Bacon & Thomas, PLLC

(57) ABSTRACT

A display device, and method for manufacture, having a substrate; a first thin film transistor (TFT) on the substrate, the first TFT having a first active layer, a first gate insulator, and a first gate electrode; a second TFT on the substrate, the second TFT having a second active layer, a second gate insulator and a second gate electrode. The first gate insulator is disposed between the first gate electrode and the first active layer, and the first gate insulator is in contact with the first active layer. The second gate insulator is disposed between the second gate electrode and the second active layer, and the second gate insulator is in contact with the second active layer. A material of the first active layer is different than a material of the second active layer, and a hydrogen concentration of the second gate insulator is different from a hydrogen concentration of the first gate insulator.

13 Claims, 35 Drawing Sheets

(51) Int. Cl.
    *H01L 29/24*     (2006.01)
    *H01L 29/49*     (2006.01)
    *H01L 29/51*     (2006.01)
    *H01L 29/66*     (2006.01)
    *H01L 29/786*     (2006.01)

(52) U.S. Cl.
    CPC .. *H01L 21/02565* (2013.01); *H01L 21/02595* (2013.01); *H01L 27/1222* (2013.01); *H01L 27/1251* (2013.01); *H01L 27/1259* (2013.01); *H01L 29/24* (2013.01); *H01L 29/4908* (2013.01); *H01L 29/51* (2013.01); *H01L 29/66757* (2013.01); *H01L 29/66969* (2013.01); *H01L 29/7869* (2013.01); *H01L 29/78675* (2013.01); *H01L 29/518* (2013.01)

(58) Field of Classification Search
    CPC ......... H01L 21/02565; H01L 21/02595; H01L 27/1222; H01L 27/1251; H01L 27/1259; H01L 29/24; H01L 29/4908; H01L 29/51; H01L 29/66757; H01L 29/66969; H01L 29/78675; H01L 29/7869; H01L 29/518
    See application file for complete search history.

(56) References Cited

U.S. PATENT DOCUMENTS

| | | |
|---|---|---|
| 2016/0063924 A1 | 3/2016 | Oh et al. |
| 2016/0163745 A1* | 6/2016 | Choi ................... H01L 27/1251 257/40 |

* cited by examiner

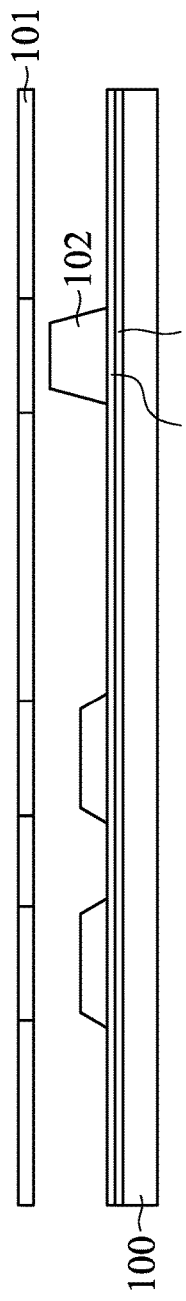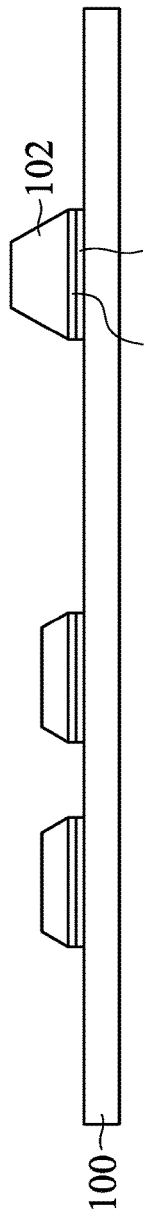

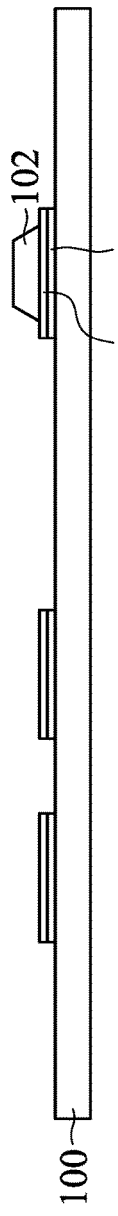
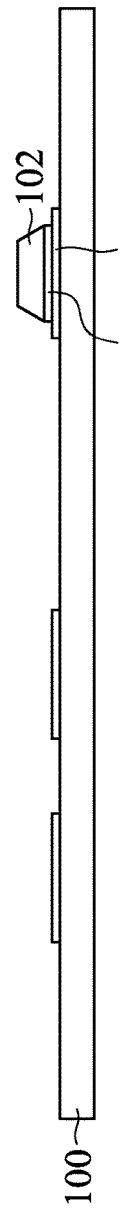
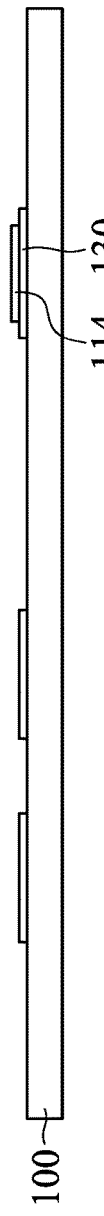

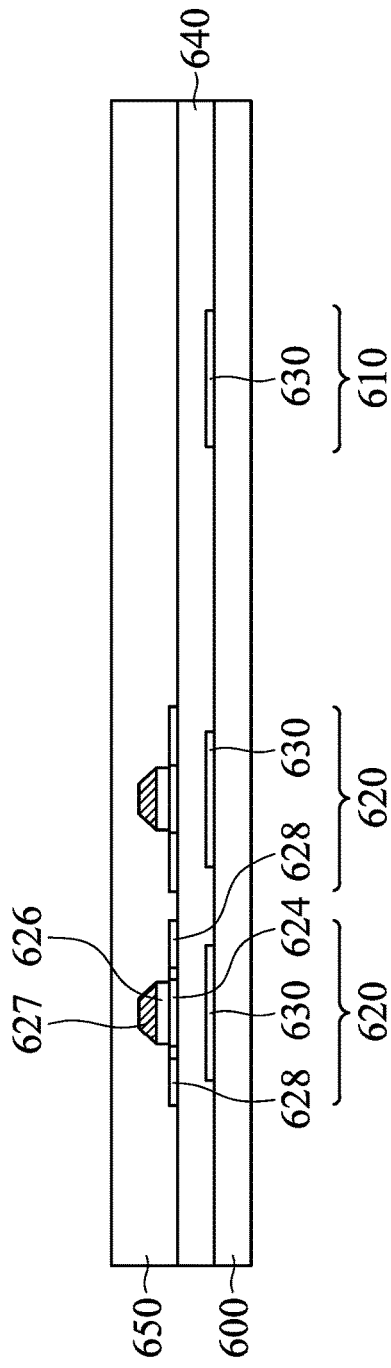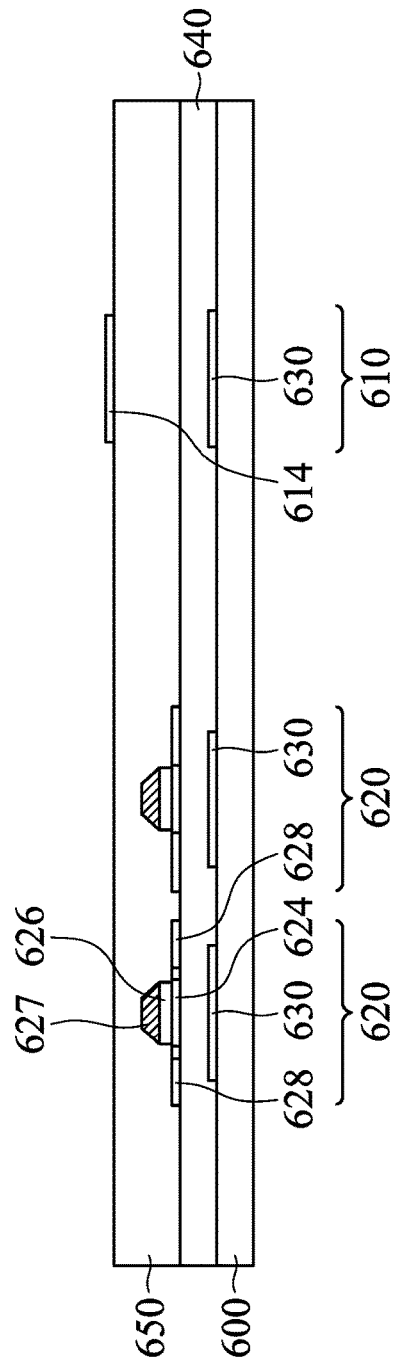

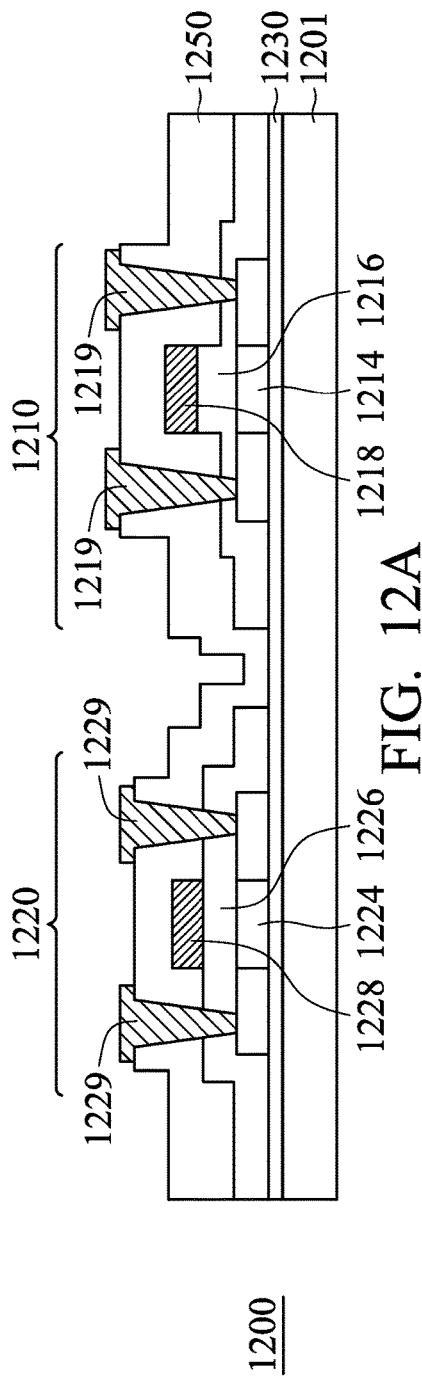
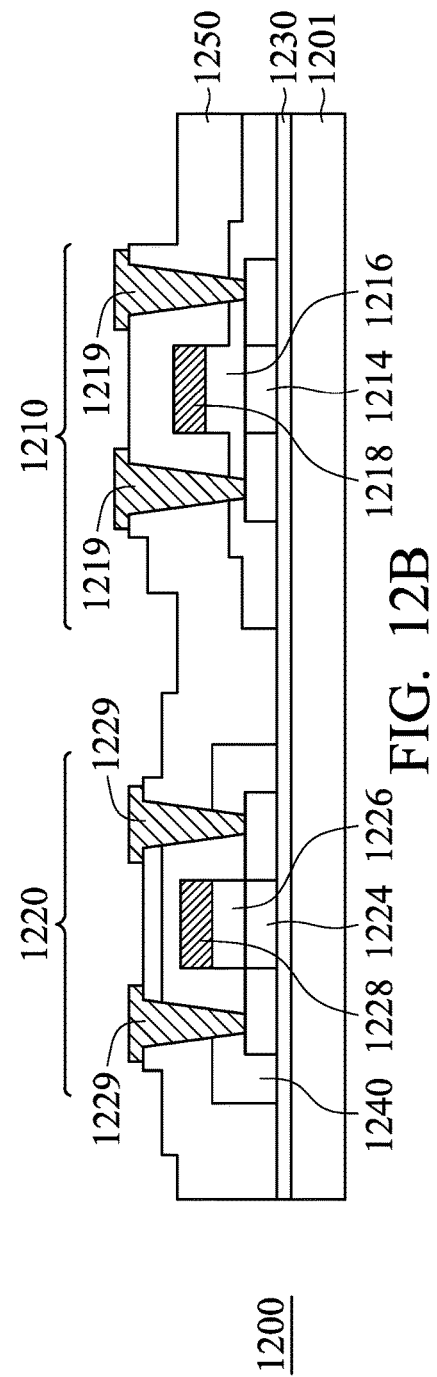
FIG. 12A
FIG. 12B

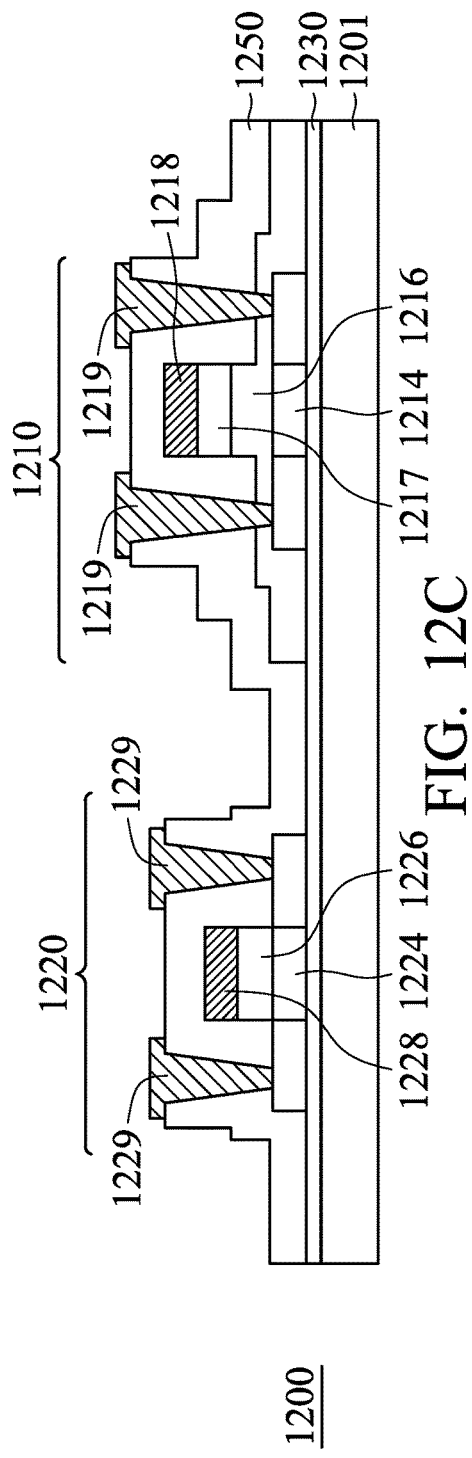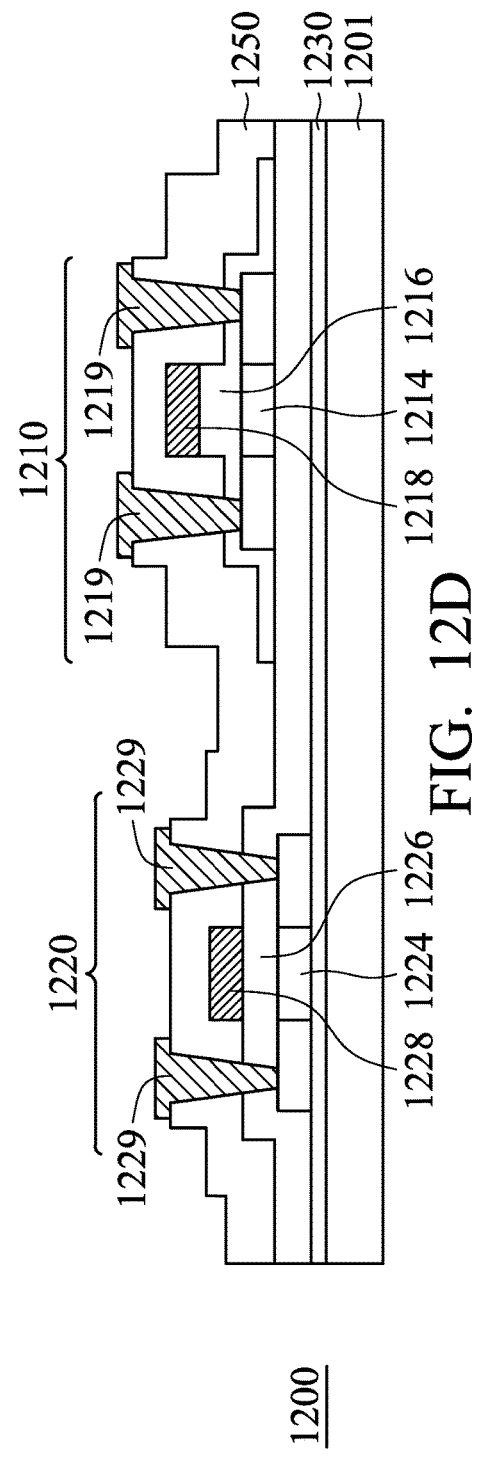

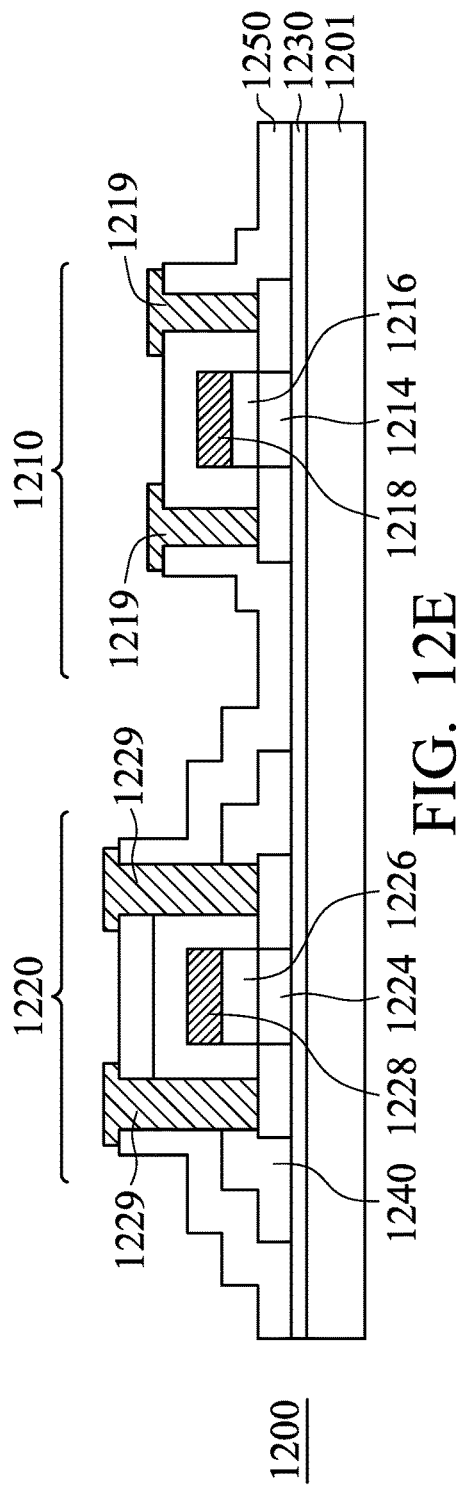
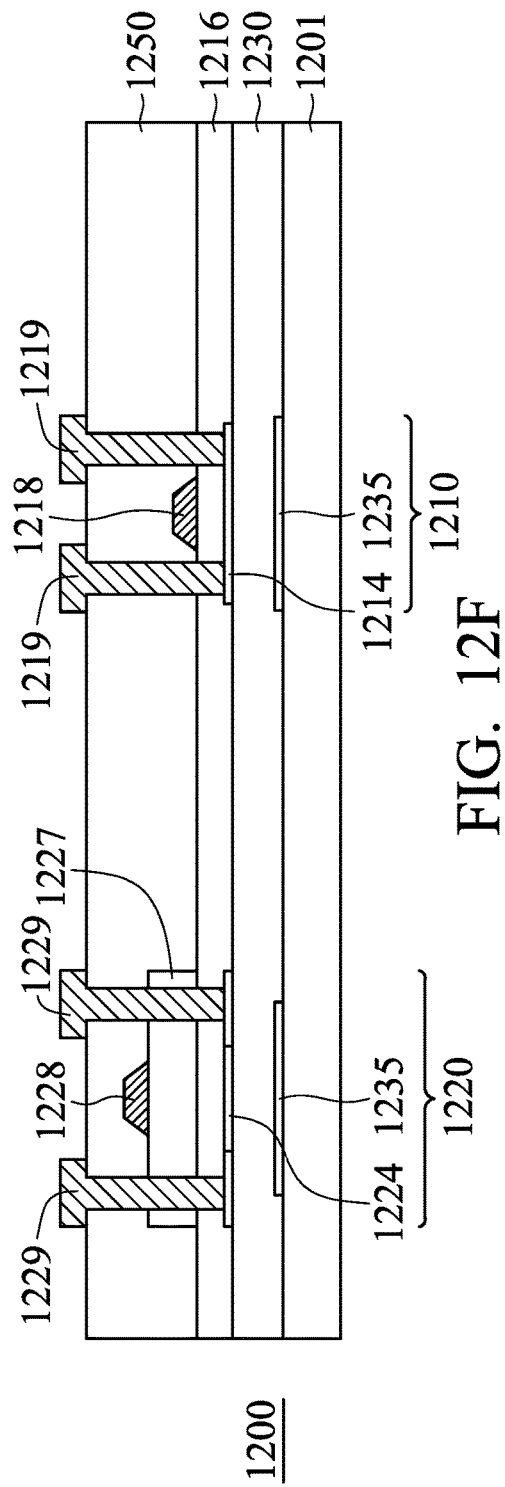
FIG. 12E
FIG. 12F

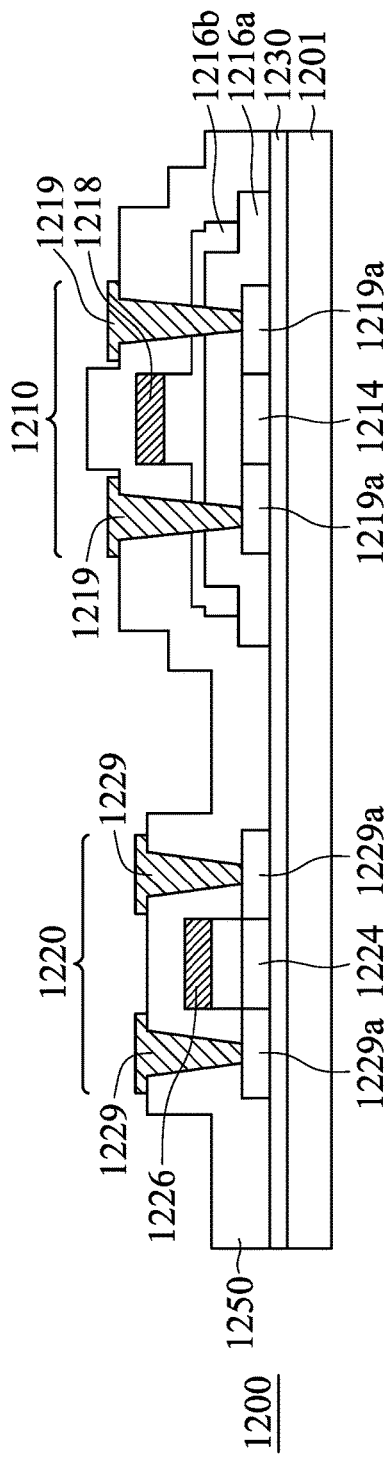
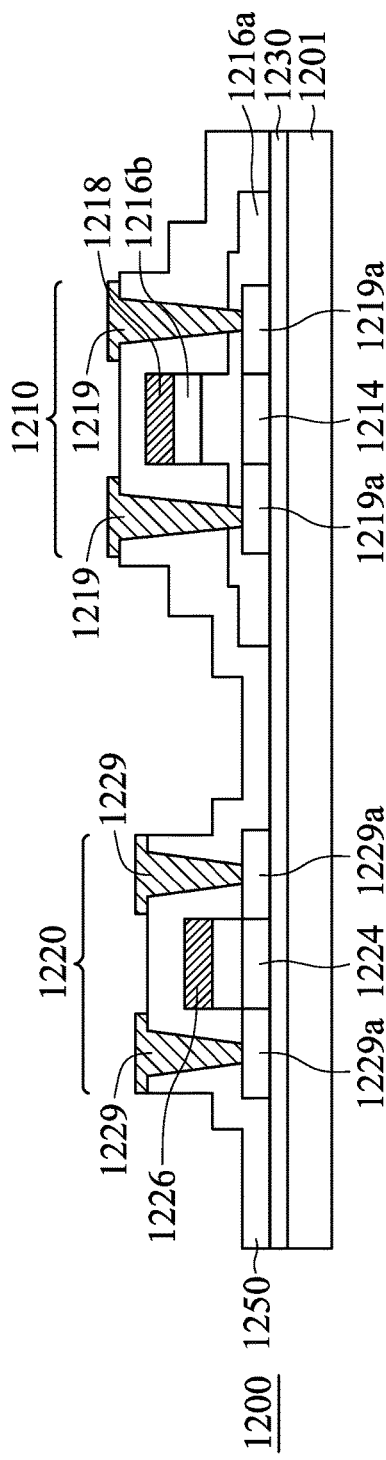
FIG. 12K
FIG. 12L

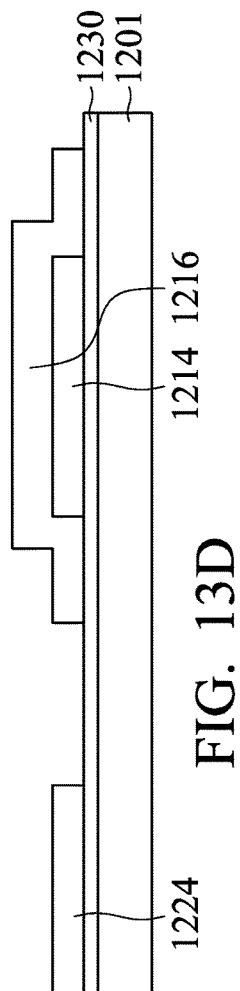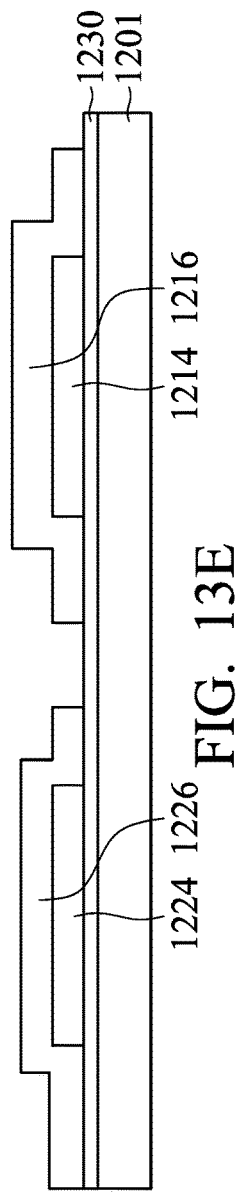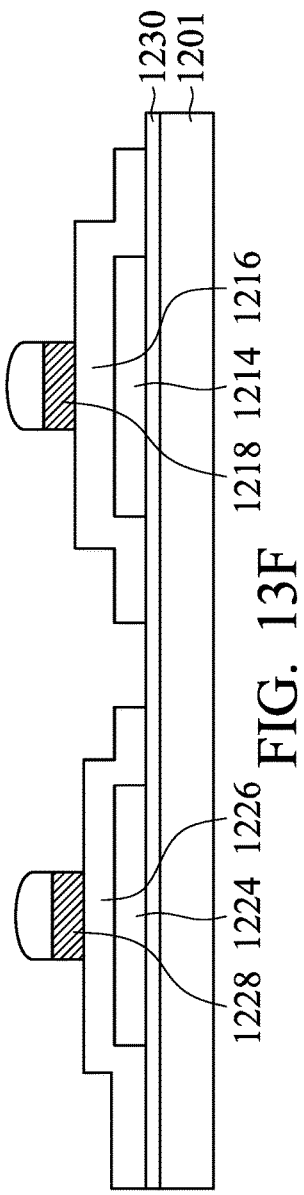

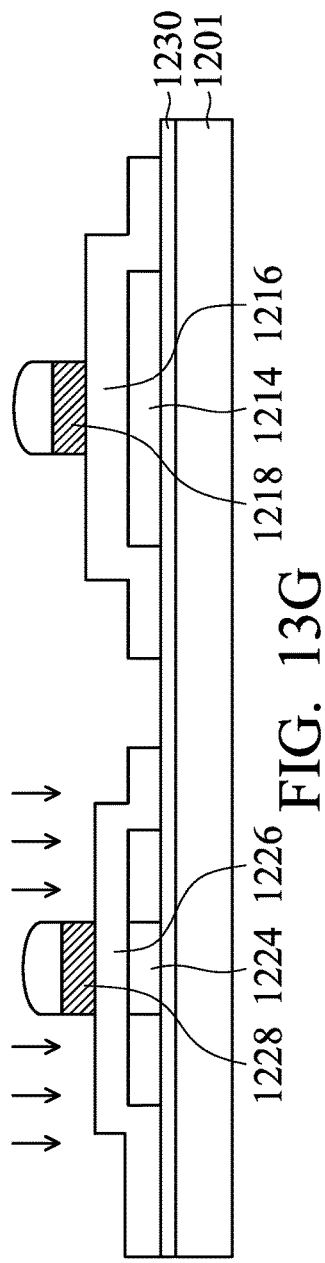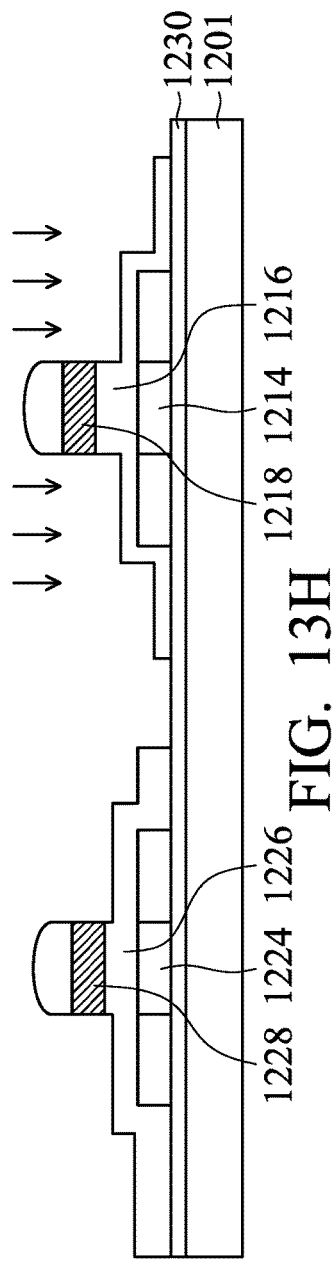

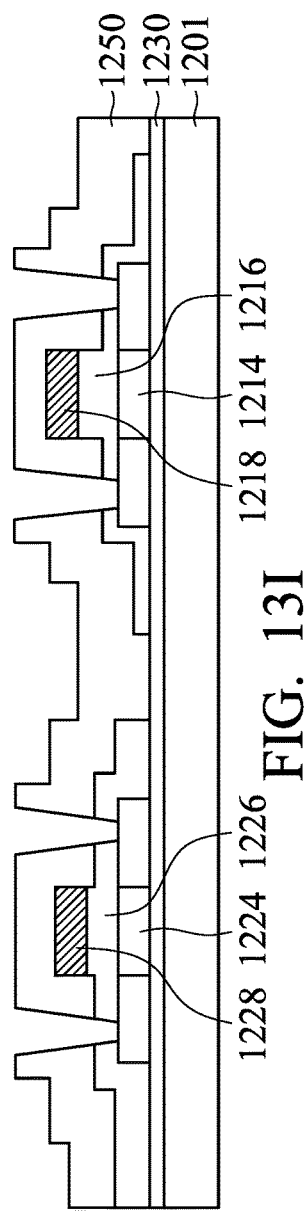
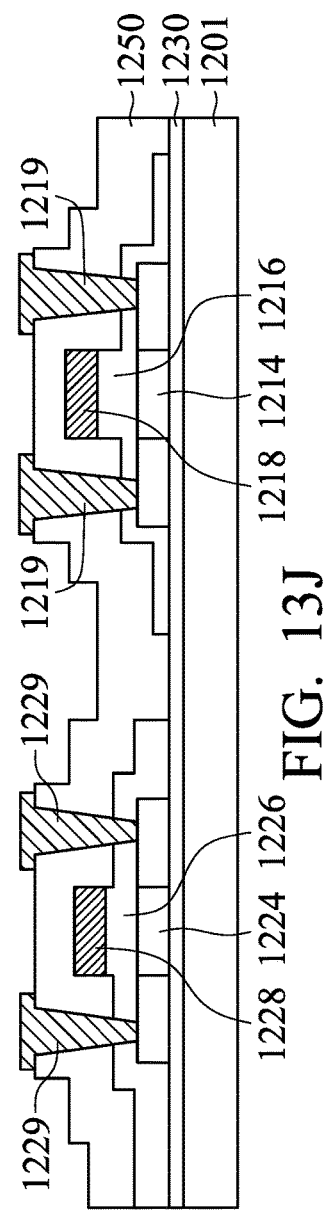

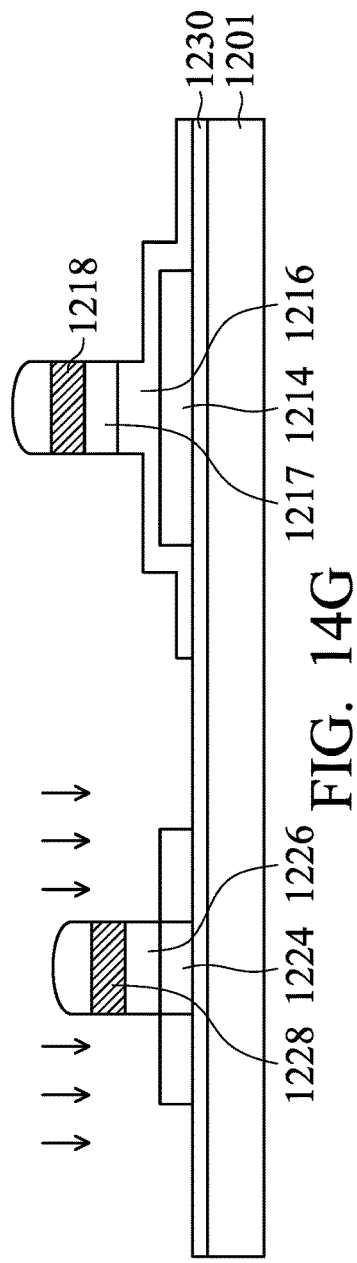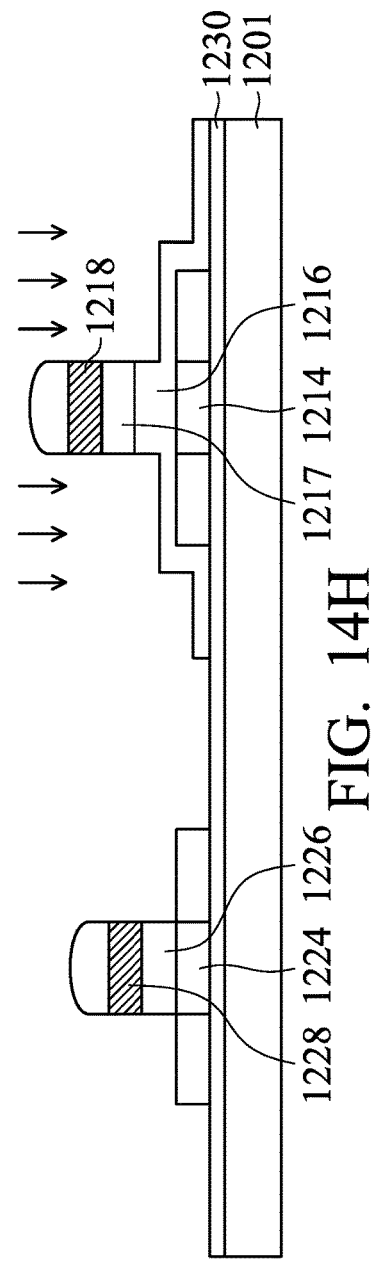

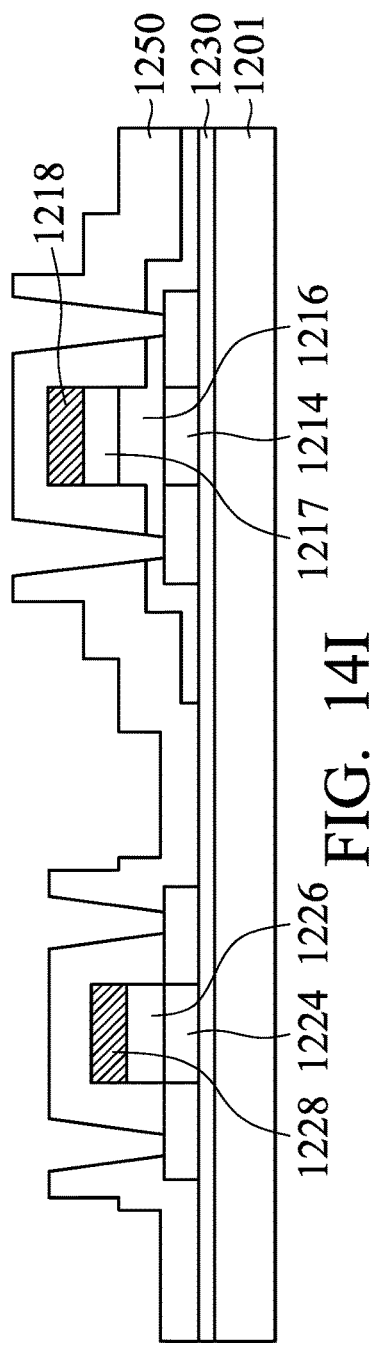
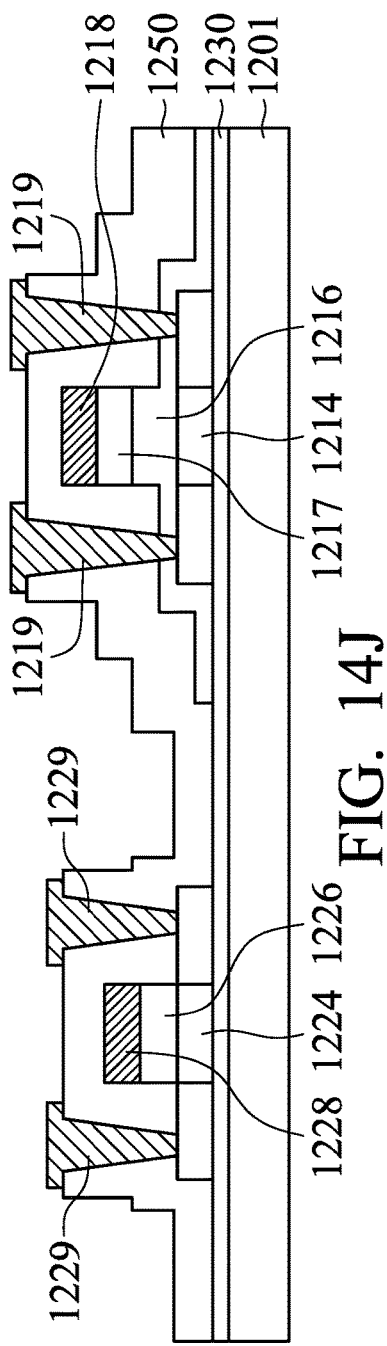
FIG. 14I
FIG. 14J

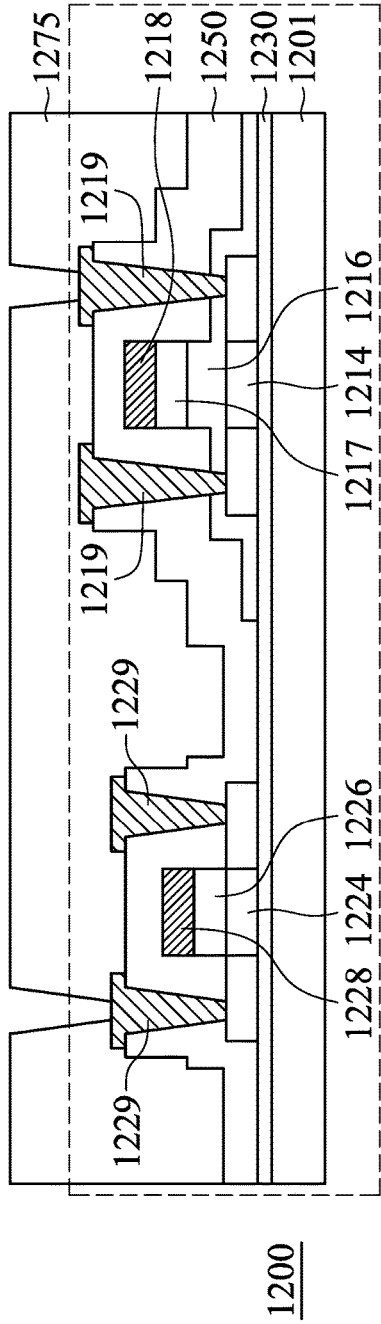
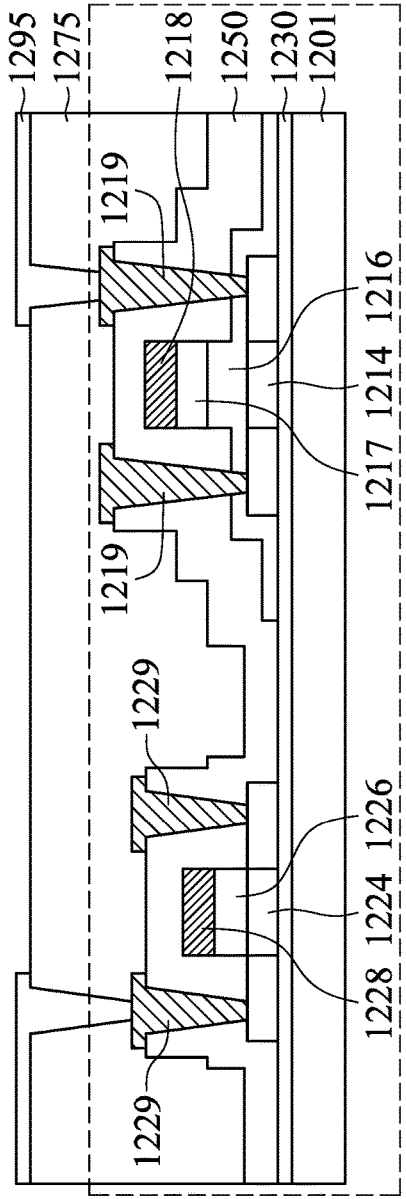
FIG. 14K
FIG. 14L

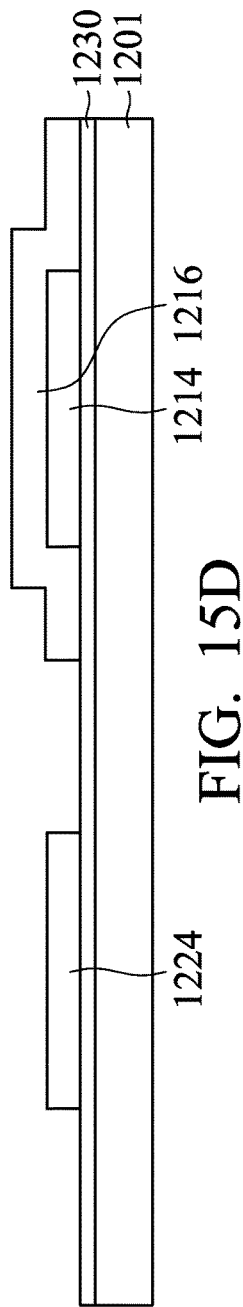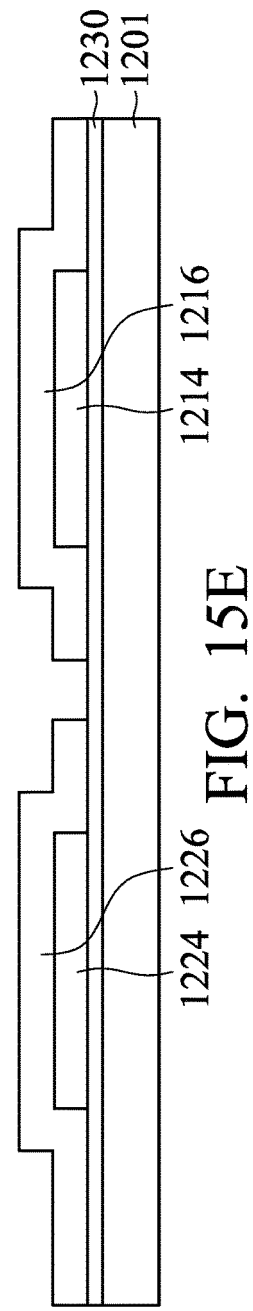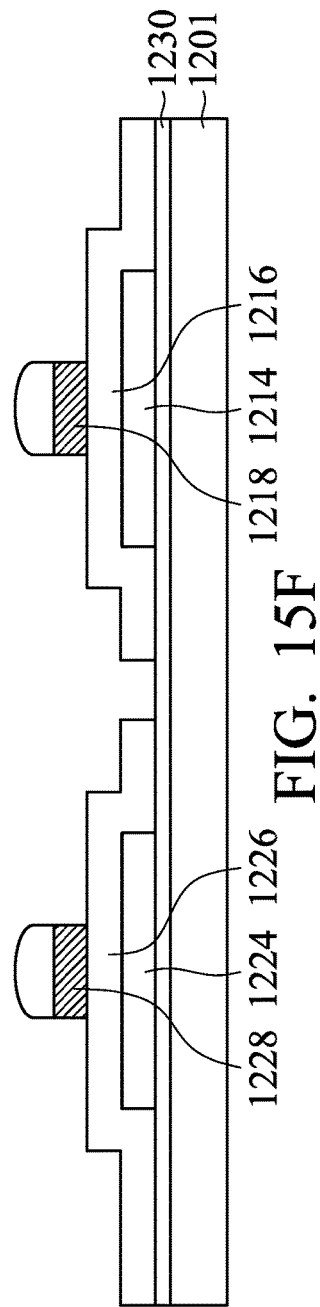

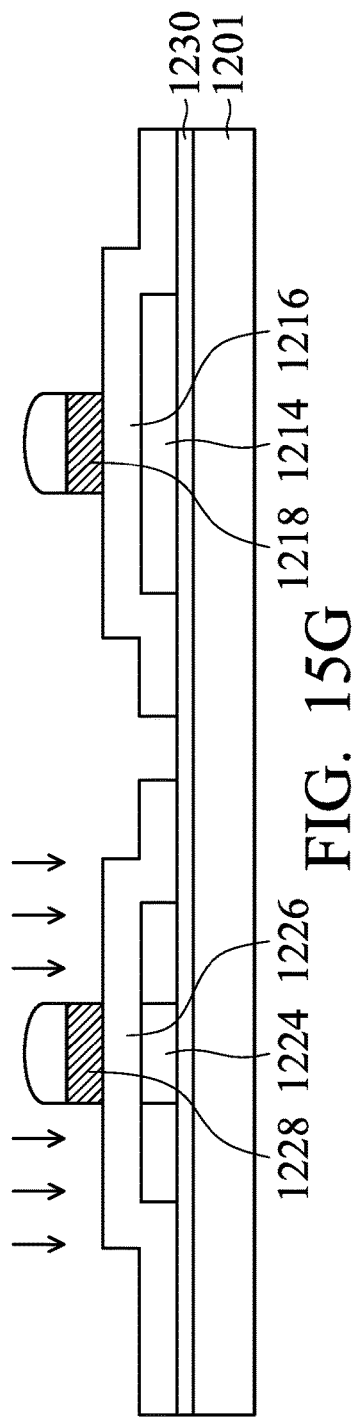
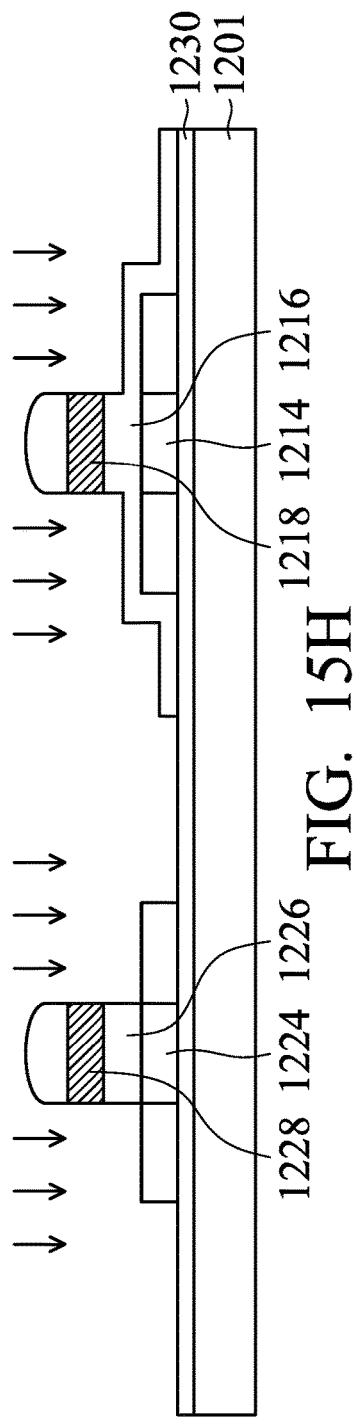

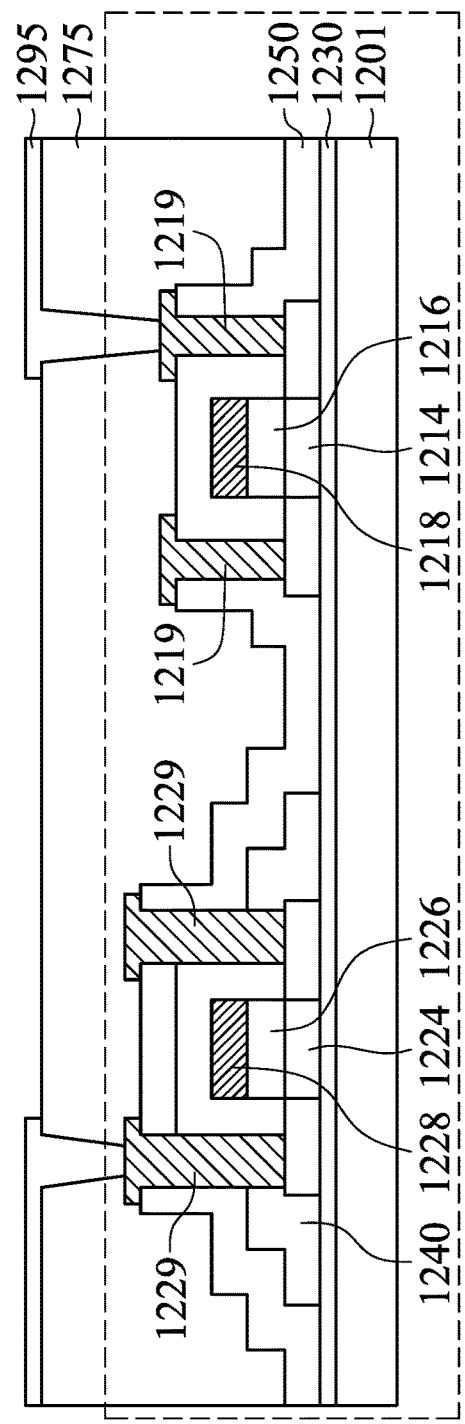

HYBRID THIN FILM TRANSISTOR STRUCTURE, DISPLAY DEVICE, AND METHOD OF MAKING THE SAME

FIELD

The present disclosure relates to displays having a thin film transistor (TFT) disposed on a substrate and methods for manufacturing the same, and more particularly to hybrid TFT structures having active layers with different semiconducting materials, and methods for manufacturing the same.

BACKGROUND

The present disclosure relates to, in one embodiment, to TFTs for use in electronic devices having a display, e.g., TVs, mobile phones, etc., using LED and OLED technology. For such a display, at high resolution, smaller size and more stable transistors with lower power and lower mura defects are required.

Metal oxide semiconductors have been used for such device fabrication due to their high carrier mobility than amorphous Silicon, low processing temperatures, and optical transparency. However, thin film transistors (TFTs) made from metal oxide semiconductors are sensitive to hydrogen content, where hydrogen between layers can act as an amphoteric impurity, e.g., acts as a donor or acceptor, and can induce a high threshold voltage shift under voltage/light bias conditions.

Therefore, the present disclosure resulted from the recognition that there is a need for a TFT and manufacturing process that is less susceptible to the hydrogen impurity problems of the prior art.

SUMMARY

Accordingly, the present disclosure relates to displays having the hybrid TFT structure and the manufacturing process thereof. The advantages and features of the disclosure are set forth in the description which follows or resulting thereof.

To achieve one of the advantages of the present disclosure, according to one aspect of the disclosure a display device utilizing a hybrid TFT structure comprises:
 a substrate;
 a first thin film transistor (TFT) on said substrate, the first thin film transistor comprising a first active layer, a first gate insulator, and a first gate electrode;
 a second thin film transistor (TFT) on said substrate, the second thin film transistor comprising a second active layer, a second gate insulator and a second gate electrode;
 wherein said first gate insulator is disposed between said first gate electrode and said first active layer, and said first gate insulator is in contact with said first active layer;
 wherein said second gate insulator is disposed between said second gate electrode and said second active layer, and said second gate insulator is in contact with said second active layer;
 wherein a material of said first active layer is different from a material of said second active layer; and
 wherein a hydrogen concentration of said second gate insulator is different from a hydrogen concentration of said first gate insulator.

According to another aspect of the present disclosure, a display device utilizing a hybrid TFT structure comprises:
 a substrate;
 a first thin film transistor (TFT) on said substrate, the first thin film transistor comprising a first active layer, a first gate insulator and a first gate electrode;
 a second thin film transistor (TFT) on said substrate; the second thin film transistor comprising a second active layer, a second gate insulator and a second gate electrode;
 wherein said first gate insulator is disposed between said first gate electrode and said first active layer, and said first gate insulator is in contact with said first active layer;
 wherein said second gate insulator is disposed between said second gate electrode and said second active layer, and said second gate insulator is in contact with said second active layer;
 wherein a material of said first active layer is different from a material of said second active layer, and a material of said first gate insulator is different from a material of said second gate insulator;
 wherein the material of said second active layer comprises metal oxide and the material of said second gate insulator comprises silicon oxide.

In at least one embodiment, the material of the second active layer comprises metal oxide.

In at least another embodiment, the hydrogen concentration of said second gate insulator is less than or equal to 5 atomic percent and greater than or equal to 0 atomic percent.

In at least a further embodiment, the hydrogen concentration of said first gate insulator is greater than 5 atomic percent and less than 10 atomic percent.

In at least a still further embodiment, a material of said first gate insulator comprises at least one of silicon oxide, silicon nitride, and silicon oxynitride, and a material of the second gate insulator comprises at least one of silicon oxide and silicon oxynitride.

In at least a still further embodiment, said first gate insulator and said second gate insulator overlap.

In another aspect of this disclosure, a method for making a display comprises the steps of:
 forming a first active layer over a substrate;
 forming a second active layer over the substrate;
 forming a first gate insulator directly on the first active layer;
 forming a second gate insulator directly on the second active layer;
 forming a first gate electrode over the first gate insulator, wherein said first active layer, said first gate insulator, and said first gate electrode form a first thin film transistor;
 forming a second gate electrode over the second gate insulator, wherein said second active layer, said second gate insulator, and said second gate electrode form a second thin film transistor,
 wherein a material of said first active layer is different from a material of said second active layer, and
 wherein a hydrogen concentration of said second gate insulator is different from a hydrogen concentration of said first gate insulator.

In at least one embodiment, the method further comprises a step of forming a blanking layer on said substrate before forming the second active layer.

It is to be understood that the above description and description in the specification are exemplary and explanatory and are not intended to limit the scope of the disclosure, where different embodiments of the disclosure can be combined without changing the scope of the disclosure.

BRIEF DESCRIPTION OF THE DRAWINGS

Examples of a display device having hybrid thin film transistor structures and methods of manufacturing the same according to different embodiments of the disclosure will now be explained in more detail with reference to the drawings, wherein:

FIGS. 2A-2F illustrate an exemplary process flow showing the deposition and formation of a display device according to the first embodiment of the disclosure.

FIGS. 8A-8D illustrate the process flow for forming a display device according to the third embodiment of the disclosure.

FIGS. 12A-12L show cross-sectional views illustrating a fourth embodiment of the disclosure.

FIGS. 13A-13L illustrate the process flow for forming one of the embodiments of the fourth embodiment of the disclosure.

FIGS. 14A-14L illustrate the process flow for forming another of the embodiments of the fourth embodiment of the disclosure.

FIGS. 15A-15M illustrate the process flow for forming another of the embodiments of the fourth embodiment of the disclosure.

Figure 1:
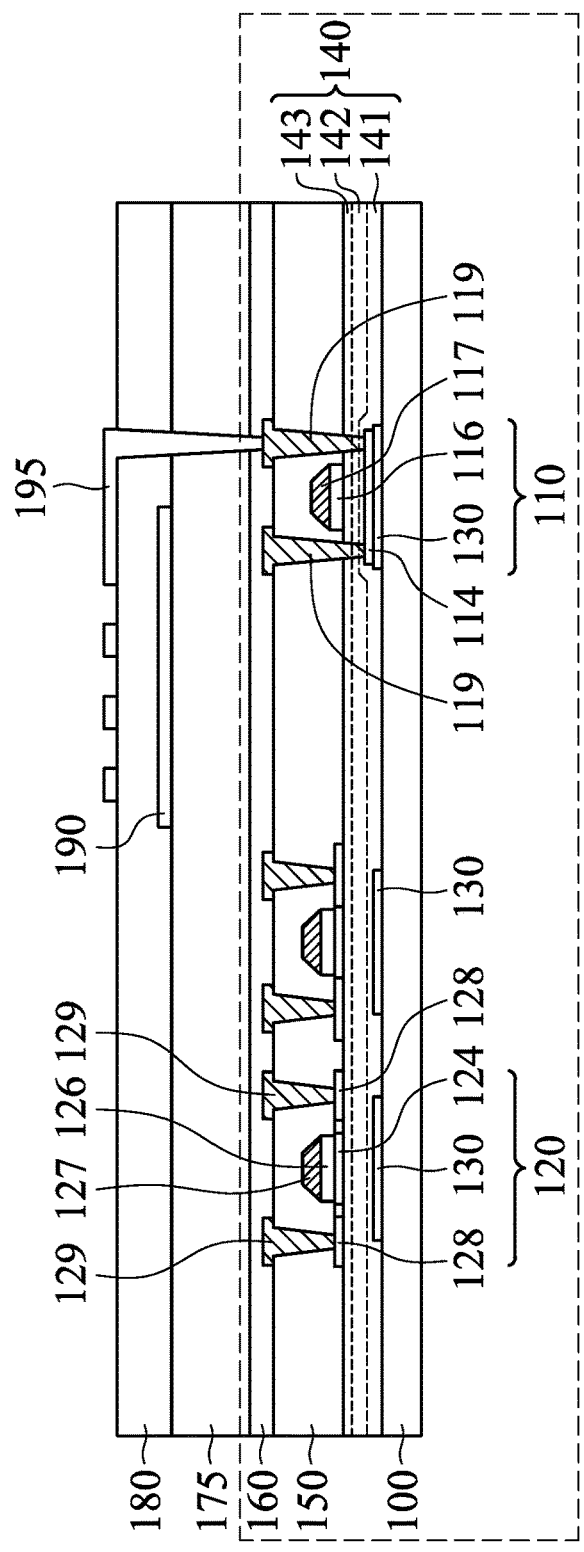
FIG. 1 is a cross-sectional view illustrating a display device according to a first embodiment of the disclosure.

In the various figures, similar elements may be provided with similar reference numbers. It should be noted that the drawing figures are not necessarily drawn to any scale, or proportion, but instead are drawn to provide an understanding of the method according to the disclosure and the resulting hybrid TFT structure and components. Thus, the illustrations are not intended to be limiting as to the scope of the disclosure described herein, but rather to provide exemplary illustrations thereof.

DETAILED DESCRIPTION OF ILLUSTRATIVE EMBODIMENTS OF THE DISCLOSURE

A. Discussion of Various Embodiments

As used in the different embodiments of the present disclosure, the term "over" or "on" broadly encompasses a layer being "directly on or over," e.g., contacting, or "indirectly on or over," e.g., not contacting, another layer. Also, unless otherwise specified, the term "under" broadly encompasses "directly under" and "indirectly under."

Although the terms "first," "second," etc. may be used to describe various layers and steps, these features should not be limited by these designations, since such designations are only being used to distinguish one feature from another. It is to be understood that the skilled person would appreciate that any combination of steps or features can be combined in any of the embodiments described below to reach the desired effects of this disclosure.

As generally discussed above, the electron mobility in TFTs needs to be enhanced to increase response speed and require lower amounts of power (or current) while maintaining a small size. For example, hydrogen concentration is important, since hydrogen ions are a component of the reactant gases used in fabrication, e.g., in SiOx or SiNx layer production. The hydrogen ions may be responsible for passivation of dangling bonds in the silicon active layer and hence increase the mobility of the silicon active layer. Incorporation of hydrogen ions in the metal oxide active layer may generate free electrons in the metal oxide active layer and increase its electron mobility to conductive level, simply losing the semiconducting properties of the metal oxide active layer. To overcome this deficiency, the present disclosure was developed for manufacturing a hybrid TFT structure for a display device, having at least a first thin film transistor and at least a second thin film transistor, where the second thin film transistor has an active layer, e.g., a metal oxide semiconductor material layer, contacting a gate insulator having a concentration of hydrogen that is lower than a concentration of hydrogen in a gate insulator associated with the first thin film transistors. For example, in one of the embodiments the display device comprises a first TFT comprising a first gate insulator disposed between a first gate electrode and a first active layer, and a second TFT comprising a second gate insulator disposed between a second gate electrode and a second active layer, where the first gate insulator is in contact with the first active layer, the second gate insulator is in contact with the second active layer, and the second gate insulator has a lower hydrogen concentration than the first gate insulator. For example, the second gate insulator may have a concentration of hydrogen less than 5 atomic percent and greater than or equal to 0 (or practically thereof), and less than 3 atomic percent and greater than or equal to 1 according to another embodiment, while the first gate insulator may have a hydrogen concentration greater than 5 atomic percent.

In some embodiments of the disclosure, a material of the active layer of the first TFT is a different from a material of the active layer of the second TFT. In an embodiment, the active layer of the second TFT is a metal oxide semiconductor (OXIDE) material layer, and the active layer of the first TFT is a low temperature polycrystalline semiconductor (LTPS) material layer, resulting in an OXIDE TFT and an LTPS TFT, but is not limited thereto. More particularly, in some embodiments of the disclosure the active layer of the second TFT is an Indium Gallium Zinc Oxide (IGZO) material, resulting in an IGZO TFT. The substrate may include a display area and a non-display area located outside and adjacent to the display area, where the display area includes a plurality of pixels arranged in a matrix for producing a display using liquid crystal, light emitting diodes (LED) or organic LED (OLED) technology, and the non-display area includes the driving circuits and elements for driving the pixels or ESD protecting. The IGZO TFT and the LTPS TFT can be included in the display area or the non-display area, or combinations thereof, where the IGZO TFT and the LTPS TFT may be positioned apart or close, e.g., adjacent, to each other along the substrate. In another embodiment, at least parts of the IGZO TFT and the LTPS TFT may overlap.

The TFT substrate can be any of the substrates known in the art, including, but not limited to glass or plastic (e.g.

Polyimide(PI), polyethylene terephthalate(PET), Polymethylmethacrylate (PMMA), etc.), where the substrate can be a rigid or flexible substrate.

The hybrid TFT structure may optionally include a blanking layer for blocking light from passing through the substrate to improve the overall contrast and performance of the display. Or, the blanking layer can also protect TFT from back light and prevent light leakage current. The blanking layer can be a single layer structure or a multilayer structure. In some embodiments the blanking layer may be provided as a black matrix layer on or above the substrate, below the IGZO TFT and/or the LTPS TFT, as a non-conductive type or a conductive type layer. The blanking layer, or black matrix layer, can comprise a blanking material including metal layers, such as chromium, aluminum, or chromium oxide, light absorbing material, such as a polymer or an oxide, black pigments particles, such as carbon black, or other materials known in the art or other materials that act to block light, such as a combination of a gate electrode and gate insulator.

Additionally, the hybrid TFT structure may also include one or more of the following: at least one buffer layer provided over the substrate to at least protect the several active layers from deterioration caused by mobile ions from substrate, promote electron mobility, prevent particles from diffusing from/to the active layer, or improve thermal conductivity; at least one interlayer dielectric layer formed over the at least one of the buffer layers, where the source and drain electrodes are formed therein, e.g., using a masking process to form contact holes in the different layers; and at least one passivation layer formed over the drain and source electrodes to passivate the layers and improve bias stability.

The buffer layer can include at least one inorganic or organic layer and/or a light shield layer, for example, an oxide layer, e.g., silicon oxide (SiOx), a nitride layer, e.g., silicon nitride (SiNx), polymer layers, etc, or combination thereof. The interlayer dielectric layer, the passivation layer or the insulating layer can be formed from various combinations of inorganic or organic insulators, or other suitable materials. The organic layer can be formed from a polymer, such as polyethylene terephthalate (PET), polyimide, polycarbonate, epoxy, polyethylene, benzocyclobutene (BCB) polymer, and/or a polyacrylate, or combination thereof. And the inorganic layer can be AlOx, SrOx, SiNx, $Al_2O_3$, SiOx, hydrogen silsesquioxane (HSQ), Poly-Siloxane, $TiO_2$ or combination thereof. Any of the above described layers can include a single layer or multiple layers according to different embodiments of this disclosure as desired.

Turning to the TFTs, the first and second TFTs are TFTs having an active layer, e.g., semiconductor material layer. In one specific embodiment, the first TFT is a LTPS TFT and the second TFT is an IGZO TFT, both of which are multilayer TFTs. The IGZO TFT includes an indium gallium zinc oxide (IGZO) active layer and the LTPS TFT includes a low temperature polycrystalline silicon (LTPS) active layer. The IGZO TFT and the LTPS TFT also include a gate electrode and may include a gate insulator, which is/are disposed over or under (e.g., above, below, and/or around) the active layer, e.g., the LTPS or IGZO semiconductor material layer. That is, the gate insulator is an insulating layer between the gate electrode and the active layer, in a top gate or a bottom gate TFT structure. Additionally, at least one of the TFTs include a source electrode and a drain electrode that are connected to a circuit or pixel, where the source and drain areas of the active layer are formed by doping, e.g., using doping impurities, and/or created during a conductorization process, e.g., using plasma treatment, or etching, or depositing additional metals to form the source and drain areas. In so doing, the TFT active layers can be doped to form n-channel and/or p-channel TFTs. The gate electrodes can be formed from a variety metals, such as Ga, In, Sn, Tn, Al, Zn, or the like, while the gate insulator can be formed from an insulating material, such as SiOx, SiNx or a high-K material, e.g., $Si_3N_4$, $Al_2O_3$, or $HfO_2$, etc. The gate electrodes can include a single layer or multiple layers according to different embodiments of this disclosure as desired. It can be noted that insulating layers with different film density or composition may be regarded as different material layers. For example, SiOx material layers with different film density or different composition ratio of silicon and oxygen, e.g. functioning as a gate insulator, a buffer layer or an interlayer dielectric layer, could be regarded as different layers. The different material layers may have different etching rates when etched with same etchant or different composition ratio.

The inventors note that although specific embodiments described herein discuss a gate insulator that is in contact with the active layer, it is understood that any layer between (above or below) the active layer of the TFT and the gate electrode may act as a gate insulator, where the benefits of the disclosure will be understood herein. And in other embodiments with a bottom gate TFT structure (not shown), the gate insulator might be disposed over the gate electrode but still disposed between the gate electrode and the active layer, but is not limited thereto.

Although not discussed in detail, the TFTs can be formed by a variety of techniques, as well known in the art, including but not limited to vacuum deposition (including chemical vapor deposition and plasma enhanced chemical vapor deposition), dip coating, spin coating, printing, spray coating, roll coating, sputtering, lithography, masking, photoresist, etc.

In one embodiment, one of the characteristics of the present disclosure is that the gate insulator contacting the active layer of the IGZO TFT is a SiOx layer having a lower hydrogen concentration than that of other SiOx or SiNx layers in the hybrid TFT structure. For example, the hydrogen concentration of the SiOx (gate insulator) layer contacting the active layer of the IGZO TFT is less than or equal to about 5 atomic percent and greater than or equal to 0 percent (and, in another embodiment, greater than or equal to 0 and less than or equal to about 3 atomic percent), whereas other SiOx or SiNx layers in the hybrid TFT structure may have a hydrogen concentration greater than or equal to about 5 atomic percent, as discussed further below. By using a gate insulator having a lower hydrogen concentration in contact with the IGZO active layer, TFT leakage current may be lower because of less impacts from hydrogen into active layer.

First Embodiment

As seen in FIG. 1, a first non-limiting embodiment of the disclosure is illustrated, where FIG. 1 is a cross sectional view of a display device illustrating a hybrid TFT structure 10 for a display that includes at least one LTPS TFT and at least one IGZO TFT on the substrate. In this embodiment, the hybrid TFT structure 10 comprises a substrate 100, e.g., glass, PI or PET, an IGZO TFT 110 and an LTPS TFT 120, which are disposed on the substrate. The IGZO TFT 120 comprises a metal oxide active layer 114, e.g., a layer of IGZO semiconductor material, a gate insulator 116, a gate electrode 117, and a source electrode and drain electrode 119. The LTPS TFT 120 comprises an active layer 124, e.g., a layer of LTPS semiconductor material, a gate insulator 126, a gate electrode 127, and a source electrode and a drain electrode 129. In this embodiment, a blanking layer is included as a black matrix layer 130, where the black matrix layer 130 is disposed on the substrate 100 below the IGZO TFT 110 and the LTPS TFT 120, where the IGZO active layer 114 is disposed over the black matrix layer 130 in the IGZO TFT 110.

In this embodiment, a buffer layer 140 is disposed over the substrate 100, below the LTPS TFT 120, and disposed on and over the IGZO active layer 114 in the IGZO TFT 110. In this case, not only does the IGZO TFT 110 have a gate insulator 116, the buffer layer 140, over the IGZO active layer 114 and below the gate electrode 117, also acts as a gate insulator. The buffer layer 140 can comprise a single layer of SiOx, or a plurality of layers comprising different layers of silicon oxide, silicon nitride, and/or silicon oxynitride. For example, in one embodiment a first sublayer 141 comprises silicon oxide SiOx, a second sublayer 142 comprises silicon nitride SiNx, and a third sublayer 143 comprises silicon oxide SiOx. As discussed above, one of the important characteristics of the present disclosure is that the layer contacting, e.g., directly adjacent on or over the active layer, e.g., the IGZO active layer 114, that is, the first sublayer 141, is a SiOx layer having a lower hydrogen concentration than that of other SiOx or SiNx layers in the hybrid TFT structure. For example, the hydrogen concentration of the first sublayer 141 is less than or equal to about 5 atomic percent and greater than or equal to 0 percent (and, in another embodiment, greater than or equal to 0 and less than or equal to about 3 atomic percent), whereas other SiOx or SiNx layers in the hybrid TFT structure may have a hydrogen concentration greater than or equal to about 5 atomic percent.

More particularly, in this embodiment, the hydrogen concentration of the first sublayer 141 contacting the IGZO active layer 114 is lower than a hydrogen concentration of the gate insulator 126 contacting the first active layer 124, e.g., the LTPS semiconductor material.

On the buffer layer 140, the LTPS active layer 124 is formed or deposited to form the LTPS TFT 120. The LTPS TFT 120 has gate and source electrodes 129 connected to a source area (or region) and a drain area 128 on the LTPS active layer, which are formed by doping, e.g., to form an n-type or p-type TFT, where the gate insulator 126 and the gate electrode 127 are formed or deposited over the LTPS active layer 124. In the IGZO TFT 110, the gate insulator 116 and gate electrode 117 are formed on the buffer layer 140 above the IGZO active layer 114. The hybrid TFT structure also includes an interlayer dielectric layer 150 formed or deposited over the buffer layer 140, the IGZO TFT 110, and the LTPS TFT 120. The interlayer dielectric layer 150 can be a single layer or a multilayer structure, where the layer(s) can comprise SiOx and/or SiNx.

The source and drain electrodes are formed on or disposed in/through the interlayer dielectric layer 150, e.g., through contact holes, where the source and drain electrodes 119 are provided for the IGZO TFT 110 and the source and drain electrodes 129 are provided for the LTPS TFT 120 which contact the source and drain areas 128. In this embodiment, the LTPS TFT 120 is an n-channel TFT or a p-channel TFT, and wherein when at least two LTPS TFTs are provided, the pair of LTPS TFTs define an n-channel TFT and a p-channel TFT. As further seen in FIG. 1, the IGZO active layer 114 is not on the same plane as the LTPS active layer 124. That is, the LTPS active layer and the IGZO active layer are disposed at different sides of the buffer layer 140. As discussed above, one of the advantages of the disclosure, is that the gate insulator of the IGZO TFT has a hydrogen concertation less than a hydrogen concentration of the gate insulator of the LTPS TFT.

The hybrid TFT structure also includes over or on the interlayer dielectric layer 150 and source and drain electrodes 119, 129, a first passivation layer 160, where the passivation layer is formed from silicon nitride, SiNx, or any other layer as known in the art.

In an embodiment, ex. an LCD display, after the hybrid TFT structure 10 is provided, an insulating layer 175 can be further provided on the first passivation layer 160. The insulating layer 175 could be an organic layer or an inorganic layer. The organic layer can be formed from a polymer, polyethylene terephthalate (PET), polyimide, polycarbonate, epoxy, polyethylene, benzocyclobutene (BCB) polymer, and/or a polyacrylate. And the inorganic layer can be AlOx, SrOx, SiNx, $Al_2O_3$, SiOx, hydrogen silsesquioxane (HSQ), Poly-Siloxane, $TiO_2$ or combination thereof. A common electrode 190 (or pixel electrode in another embodiment) can be provided on or over the insulating layer 175. Lastly, a second passivation layer 180 can be provided over the insulating layer 175 and common electrode 190 (or pixel electrode), where pixel electrode (or common electrode in another embodiment) 195 is provide on or above the second passivation layer 180 and connected to the source (or drain) electrode 119 of the IGZO TFT 110.

In another embodiment, ex. an LED display, after the hybrid TFT structure 10 is provided, an insulating layer 175 can be further provided on the first passivation layer 160 and a pixel (or anode electrode) electrode and a common electrode (or cathode electrode) can be provided on or over the insulating layer 175. Another insulating layer could be provided between the pixel electrode and the common electrode. A display medium layer, not shown on the figures, can also be provide between the pixel electrode and the common electrode, wherein the display medium layer is separated by the insulating layer, and the display medium layer could be organic light emitting layer, an inorganic light emitting layer or and quantum dot light emitting layer.

As discussed further with reference to FIGS. 2A-2F, an exemplary method of a display device for manufacturing the hybrid TFT structure with top gate TFT structure is described. In a first step, as seen in FIG. 2A, a blanking material is optionally deposited on a substrate 100 to form a black matrix layer 130, and the IGZO active layer 114 is deposited over the black matrix layer 130, where each layer has a thickness between 50 and 5000 Angstroms. In a second step, as illustrated in FIG. 2B, a first mask process, e.g., a photoresist process, is used to form patterned coatings, e.g., photo resist 102, on the substrate 100, IGZO active layer 114, and black matrix layer 130, where the LTPS TFT areas, e.g., where the LTPS TFT 120 will be formed, are exposed using a mask 101 having at least one half tone region, while the IGZO TFT area, e.g., where the IGZO TFT 110 will be formed, is exposed using an obstacle region. As seen in FIG. 2C, the IGZO active layer and the black matrix layer are then etched to be formed in the IGZO TFT area and the LTPS TFT areas. The photoresist is then ashed, as seen in FIG. 2D, to remove the photo resist, where since the IGZO TFT 110 was exposed using an obstacle region, the IGZO TFT 110 has a remainder of photoresist. The IGZO active layer is then etched, so that the IGZO active layer 114 is removed from the LTPS TFT areas and etched in the IGZO TFT area so that the IGZO active layer 114 is patterned on the black matrix layer 130 to form the IGZO TFT 110. Finally, the remainder of the photoresist is removed, e.g., via stripping.

Figure 3:
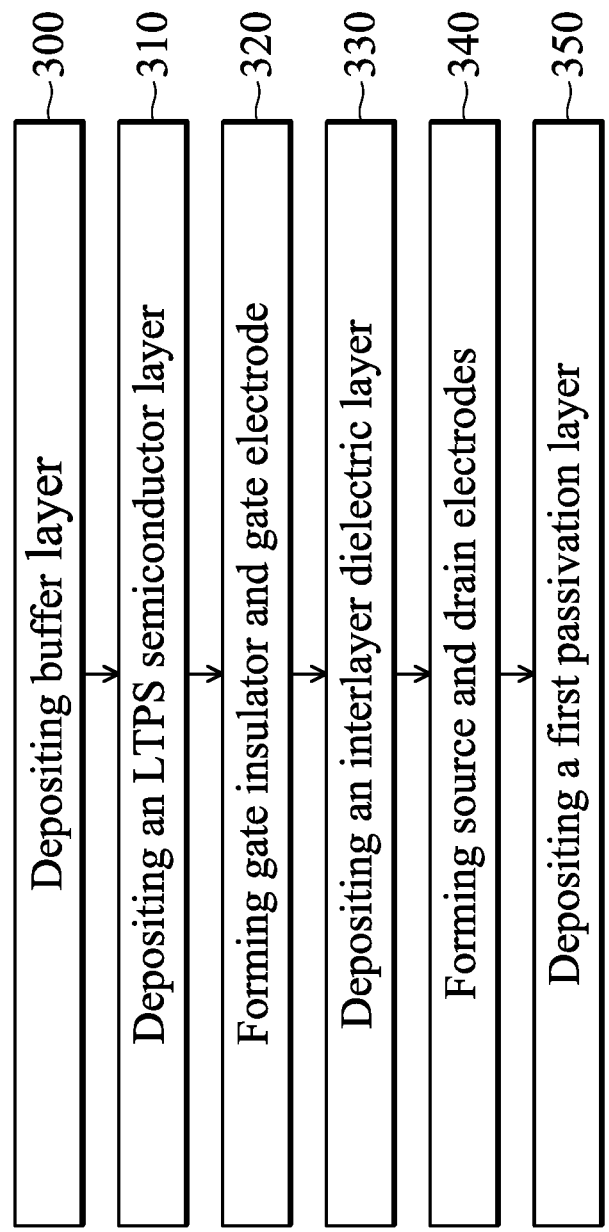
FIG. 3 is a process flow diagram illustrating a method for manufacturing a display device according to the first embodiment of the disclosure.

In a second manufacturing step, as seen in FIG. 3, the buffer layer is deposited over the substrate, IGZO TFT area, and the LPTS TFT area, by depositing at least one sublayer, e.g., a first sublayer, at step 300 having a thickness between 50 and 5000 Angstroms. The first sublayer comprises an oxide material, such as SiOx, having a lower hydrogen concentration than other oxide layers in the hybrid TFT structure. For example, the first sublayer may have a hydrogen concentration of less than or equal to 5 atomic percent and greater than or equal to 0, and in another embodiment, less than or equal to 3 atomic percent and greater than or equal to 1, comparison to, for example, a hydrogen concentration of between 5 and 10 atomic percent in other SiOx layers, and a hydrogen concentration of between 10 and 20 atomic percent in SiNx layers in the hybrid TFT structure. The first sublayer may be formed by SiOx growing/deposition methods, e.g., RF plasma hydrogenated silicon, but not limited to. For example, in a SiOx deposition method, a substrate is positioned in a plasma processing chamber under vacuum, wherein one or more process gases are introduced and excited with an electrical field to cause the dissociation of the gases into radicals and other ions. The radicals and other ions diffuse to the surface of the substrate, where a chemical reaction occurs on the surface of the substrate. The reaction product diffuses and is deposited on the surface of the substrate, where the byproducts diffuse through the interface boundary layer and leave the deposition system via the main stream along with unused reactants.

The plasma in process chamber may be produced inductively using RF coils, capacitively using plate electrodes, or using microwave energy, where the plasma and reactant gas are used to deposit the particles on the substrate. For example, the SiOx layer having the lower hydrogen concentration can be deposited using high RF power, e.g., between 7700-10,000 W, with a reactant gas having a silicon containing precursor, such as silane or silicon tetrafluoride, etc., and/or by annealing the SiOx layer at temperatures between 450-500° C. The first sublayer having the lower hydrogen concentration is directly adjacent, e.g., contacts, the IGZO TFT semiconductor material to promote higher electron mobility, as discussed above. The buffer layer can also include additional sublayers, such as second or third sublayers or a combination thereof, which may be silicon oxide or silicon nitride layers having a higher hydrogen concentration than the first sublayer. The second and third sublayers are between the first sublayer and the substrate.

It is appreciated that the control of at least one of the RF power, glass temperature, chamber pressure, gas flow rate, and the distance between glass and plate (spacing) can be used to produce the different layers of the TFTs having varying hydrogen concentrations. For example, the gate insulator for the IGZO TFT (GI SiOx-IGZO), the gate insulator for the LTPS TFT (GI SiOx-LTPS), and the interlayer dielectric layer (ILD SiNx) can be formed according to the following parameters:

In some embodiments, the PECVD deposition conditions are inter-correlated, e.g., power is set at 8000 W $N_2O/SiH_4$ ratio at 90, and spacing at 650 mils to obtain a silicon oxide film with hydrogen concentration lower than 3% (at %). Additionally, to quantify the hydrogen concentration, SIMS (Secondary Ion Mass Spectrometer) and/or RBS (Rutherford Back-Scattering Spectrometry) equipment and processes can be used to measure such hydrogen concentration in the layers.

In the next manufacturing step (step 310), the LTPS active layer is deposited and/or formed over the buffer layer in the LTPS TFT areas using a masking process and a known deposition method in the art, such as, laser annealing, plasma enhanced chemical vapor deposition, chemical vapor deposition, expanding thermal plasma, crystallization step, or similar methods using a Si-precursor material, where the LTPS active layer comprises low temperature polycrystalline silicon semiconductor material. During or after the depositing of the LTPS active layer on the buffer layer, a doping process is used to form source and drain areas (or regions) so that a channel area (not shown) is formed in the LTPS active layer. In so doing, the LTPS TFTs can define an n-channel TFT or a p-channel TFT accordingly. Then, in step 320, a gate insulator is formed in the LTPS TFT area and the IGZO TFT area, where the gate insulator is formed on, over, or around the LTPS active layer and formed over the IGZO active layer, respectively. The gate insulator can be formed from a silicon oxide or a silicon nitride material. A gate electrode is then formed on or over each gate insulator in the LTPS TFT and the IGZO TFT over the active layer, e.g., the semiconductor material. In another embodiment, a TFT structure with bottom gate (not shown on the figures), a gate electrode is deposited before depositing a gate insulator, and then an active layer is deposited on the gate insulator. An interlayer dielectric layer is then deposited at step 330 across the entire structure using one of the known masking and/or deposition processes. Each of these layers has a thickness between having a thickness between 50 and 5000 Angstroms.

As discussed above, one of the important aspects of one of the embodiments of the disclosure, is that the gate insulator over the IGZO active layer is formed to have a lower hydrogen concentration than the gate insulator over the LTPS active layer.

Then, the source and drain electrodes are formed in the LTPS TFT area and the IGZO TFT area in step 340, e.g., by forming channels through the interlayer dielectric layer, such as, through contact holes that were patterned by masking and etching after or during the deposition process of the layers. At optional step 350, a first passivation layer can then be deposited across the entire structure, e.g., the source and drain electrodes and the interlayer dielectric layer. Such layers can be deposited using a deposition process known in the art and/or can also include a masking process for patterning the layers to include contact holes for exposing

| Item/Parameter | | GI SiOx-IGZO | GI SiOx-LTPS | ILD SiNx |
|---|---|---|---|---|
| Hydrogen Concentration | | 0%~3% | 5%~10% | 10%~20% |
| PECVD Parameters | Reactant gases | $N_2O(g)$ + $SiH_4(g)$ | | $SiH_4(g)$ + $NH_3(g)$ + $N_2(g)$ |
| | Temperature | 340° C.~360° C. | | 200° C.~220° C. |
| | Power (@ 13.56 MHz RF) | 5000 W~13000 W | 5000 W~13000 W | 5000 W~13000 W |
| | $N_2O/SiH_4$ ratio | 50~200 | 25~75 | |
| | | 400-1200 mils | 400-1200 mils | 600-1300 mils |
| | | 600-1500 mtorr | 600-1500 mtorr | 800~2000 mTorr | the source and drain electrodes in the LTPS TFT area and the IGZO TFT area. In so doing, the IGZO TFT is defined in the IGZO TFT area and the LTPS TFT is defined in the LTPS TFT area.

In view of such steps, a hybrid TFT structure is formed where a gate insulator of IGZO TFT is in contact with the IGZO semiconductor material layer, where the second insulator of IGZO TFT has a lower hydrogen concentration than the gate insulator of LTPS TFT.

Second Embodiment

Figure 4:
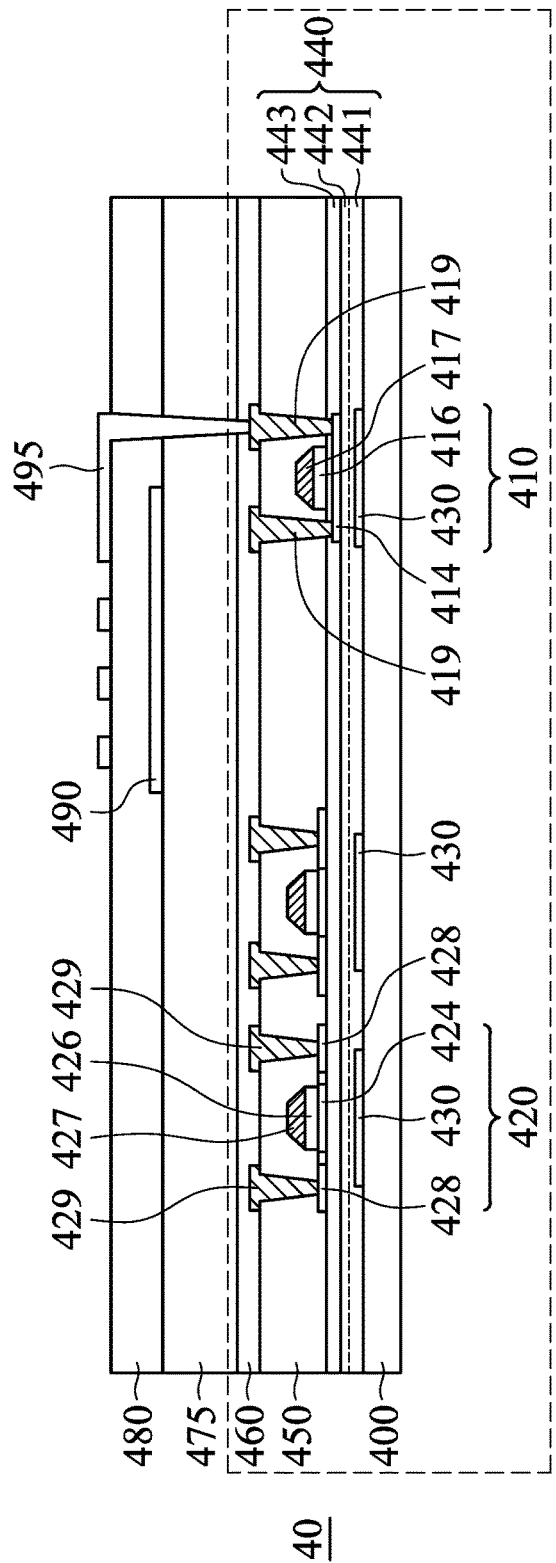
FIG. 4 is a cross-sectional view illustrating a display device according to a second embodiment of the disclosure.

As seen in FIG. 4, a second embodiment of the disclosure is illustrated, which is similar to the first embodiment. In this embodiment, however, the buffer layer includes three sublayers and the IGZO active layer is deposited and formed on one of the sublayers of the buffer layer above the blanking layer, e.g., the black matrix layer, as opposed to being formed directly on the blanking layer as in the first embodiment.

For example, as shown in FIG. 4, the hybrid TFT structure 40 includes a substrate 400 having an IGZO TFT 410 and LTPS TFT 420, which are disposed on the same substrate. In this embodiment, a blanking material is disposed on the substrate 400 below the IGZO TFT 410 and the LTPS TFT 420 to form a black matrix layer 430. A buffer layer 440 is disposed over the black matrix layer 430 and the substrate 400, where the buffer layer 440 comprises a first sublayer 441, a second sublayer 442, and a third sublayer 443. The first and second sublayers 441, 442 are provided over the black matrix layer 430 and the substrate 400, where the first and second sublayers can comprise SiOx and/or SiNx layers, and exemplary the first sublayer 441 being a SiNx layer and the second sublayer 442 being a SiOx layer. The IGZO active layer 414 is then disposed on or over the second sublayer 442, and the third sublayer 443 is then formed or deposited over the second sublayer 442 and over (and/or around) the IGZO active layer 414. In this embodiment, buffer layer 440 acts as a gate insulator since it is between the gate electrode 417 and the IGZO active layer 414, and the third sublayer 443 in contact with the IGZO active layer 414 is a SiOx layer that has a lower hydrogen concentration than other SiOx or SiNx layers in the hybrid TFT structure 40.

The LTPS TFT 420 includes the LTPS active layer 424 formed or deposited on the buffer layer 440, where portions of the LTPS active layer have been doped with impurities to form a source area and a drain area 428, and the gate insulator 426 and the gate electrode 427 have been formed or deposited over the active layer 424, e.g., the LTPS semiconductor material. The IGZO TFT 410 includes the gate insulator 416 and gate electrode 417 formed on the buffer layer 440 over the active layer 414, e.g., the IGZO semiconductor material. The hybrid TFT structure 40 also includes an interlayer dielectric layer 450 that has been formed or deposited across the entire structure. The interlayer dielectric layer 450 can be a single layer or a multilayer structure, where one layer comprises SiOx and another layer comprises SiNx. Each of the LTPS TFTs 420 and the IGZO TFT 410 includes the source and drain electrodes that have been formed on or disposed in or through the interlayer dielectric layer 450, e.g., through contact holes, where source and drain electrodes 419 are provided for the IGZO TFT 410 and source and drain electrodes 429 are provided for the LTPS TFT 420 to contact the source and drain areas of the active layer. The LTPS TFT 420 can define an n-channel TFT or a p-channel TFT based on the doping impurities used for doping the source and drain areas, while the source and drain areas of the IGZO active layer are formed by conductorization, plasma treatment, dry etching, or made from aluminum, titanium, molybdenum, copper, copper-manganese alloy, or a combination thereof. As in the first embodiment, the LTPS active layer 424 is not on the same plane as the IGZO active layer 414. That is, the LTPS active layer and the IGZO active layer are disposed at different sides of the third sublayer 443.

The hybrid TFT structure also includes over or on the interlayer dielectric layer 450 and source and drain electrodes 419, 429, a first passivation layer 460, where the passivation layer is formed from silicon nitride, SiNx. Additionally, after the hybrid TFT structure 40 are provided, an insulating layer 475 can be provided on the first passivation layer 460, where a common electrode 490 (or pixel electrode) can be disposed on or over the insulating layer 475. The insulating layer 475 can be an organic layer or an inorganic layer. Lastly, a second passivation layer 480 is provided over the insulating layer 475 and the common electrode 490, where a pixel electrode (or common electrode) 495 is provide on or above the second passivation layer 480 and connected to the source (or drain) electrode 419 of the IGZO TFT 410.

In another embodiment, ex. an LED display, after the hybrid TFT structure 40 are provided, a pixel (or anode electrode) electrode and a common electrode (or cathode electrode) could be provided on or over the insulating layer 475. A display medium layer, not shown on the figures, could also be provide between the pixel electrode and the common electrode, and the display medium layer could be organic light emitting layer, an inorganic light emitting layer or and quantum dot light emitting layer. Similar structure as mentioned in the first embodiment is omitted here.

Figure 5A:
FIGS. 5A-5D illustrate an exemplary process flow for forming a display device for the second embodiment of the disclosure.
Figure 5B:
Figure 5C:
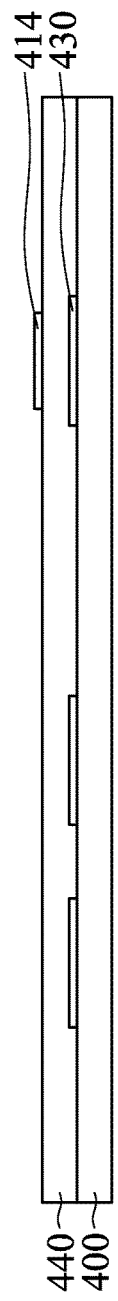
Figure 5D:
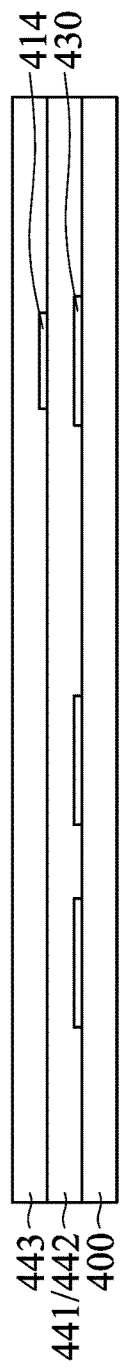

As discussed further with reference to FIGS. 5A-5D, the manufacturing method for the second embodiment of the hybrid TFT structure is described. For example, in a first step, as seen in FIG. 5A, a blanking material is deposited to form a black matrix layer 430 on a substrate 400, e.g., using a deposition and masking process, to form patterned layers in the IGZO TFT area and the LTPS TFT area. In a second step, as illustrated in FIG. 5B, a first sublayer is provided over the substrate 400 and the black matrix layer 430, where the first sublayer can comprise a single layer of SiOx or multiple layers, e.g., a SiNx layer as a bottom layer and a SiOx layer as a top layer. As seen in FIG. 5C, the IGZO active layer 414 is deposited over the SiOx sublayer, e.g., through a deposition and masking process. Finally, a second sublayer is deposited over the entire surface, which includes the surface of the other buffer sublayer and the IGZO active layer. The second sublayer comprises a SiOx layer which has a lower hydrogen concentration than other SiOx or SiNx layers of the hybrid TFT structure 40, and in particular a lower hydrogen concentration than a gate insulator of the LTPS TFT. For example, the second sublayer has a hydrogen concentration of less than or equal to 5 atomic percent, and, in another embodiment, less than or equal to 3 atomic percent, in comparison to other SiOx layer in the hybrid TFT structure 40 having a hydrogen concentration of between about 5 and 10 atomic percent, and SiNx layers of the hybrid TFT structure 40 having a hydrogen concentration between about 10 and 20 atomic percent. The remainder of the hybrid TFT structure 40 is produced in a similar manner as in the first embodiment.

Third Embodiment

Figure 6:
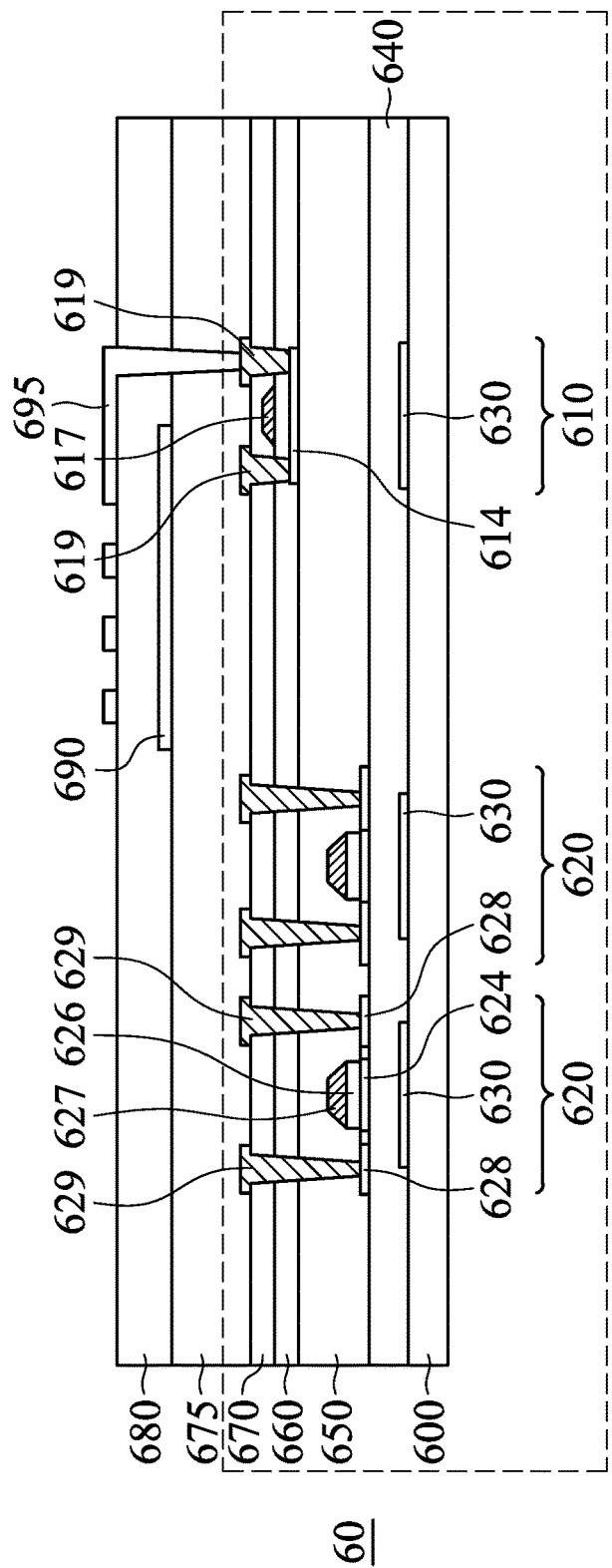
FIG. 6 is a cross-sectional view illustrating the structure of a display device according to a third embodiment of the disclosure.

As seen in FIG. 6, a third embodiment of the disclosure is illustrated. In this embodiment, the IGZO active layer is disposed on or over the interlayer dielectric layer disposed over the LTPS TFT. For example, as shown in FIG. 6, the hybrid TFT structure 60 includes a substrate 600 having an IGZO TFT 610 and an LTPS TFT 620, which are disposed on the substrate. In a non-limiting example of this embodiment, two LTPS TFTs 620 are provided to form a driver circuit, while the IGZO TFT is used in a pixel region of a display.

Similar to the above embodiments, the hybrid TFT structure 60 includes the black matrix layer 630 disposed on the substrate 600 below the IGZO TFT 610 and the LTPS TFTs 620. The hybrid TFT structure 60 also includes a first buffer layer 640 disposed over the black matrix layer 630 and the substrate 600, where the first buffer layer 640 can comprise a single layer or multiple sublayers comprising SiOx and SiNx layers, e.g., a first sublayer comprising a SiOx layer, a second sublayer comprising a SiNx layer, and third sublayer over the second sublayer comprising a SiOx layer. On the first buffer layer 640, in the LTPS TFT 620, the LTPS active layer 624 is formed or deposited, where the LTPS active layer has been doped to form a source area and a drain area 628. The LTPS TFT 620 also includes the gate insulator 626 and the gate electrode 627 which have been formed or deposited over the active layer 624 in each LTPS TFT. In this embodiment, one of the LTPS active layers 624 is doped to form an n-channel TFT and the other LTPS active layer 624 is doped to form a p-channel TFT, where the n-channel TFT and p-channel TFT are used to form the driver circuit for driving the pixel of the display.

The hybrid TFT structure 60 also includes an interlayer dielectric layer 650 that has been formed or deposited over the gate electrodes of IGZO TFT and LTPS TFT and also over the buffer layer 640. The interlayer dielectric layer 650 can be a single layer or a multilayer structure, where if the interlayer dielectric layer 650 has multiple layers, the top layer comprises SiOx and the bottom layer comprises SiNx.

In this embodiment, the IGZO TFT includes an IGZO active layer 614 that has been disposed on or over the interlayer dielectric layer 650. The hybrid TFT structure 60 then includes a second buffer layer 660 that has been deposited and/or formed on the interlayer dielectric layer 650 and the IGZO active layer 614, where the second buffer layer 660 can be a single layer of SiOx or a multilayer structure comprising at least a bottom layer of SiOx and a top layer of SiNx. As in the above embodiments, the second buffer layer 660 (or sublayer) directly adjacent to (e.g., over and around) the IGZO TFT active layer 614 is a SiOx layer that has a lower hydrogen concentration than other SiOx or SiNx layers of the hybrid TFT structure 60, and in particular the active layer 614 has a lower hydrogen concentration than the gate insulator 626 of the LTPS TFT 620. The IGZO TFT 610 further includes the gate electrode 617 that has been formed on the second buffer layer 660 over the active layer 614, e.g., the IGZO semiconductor material. In so doing, the second buffer layer 660 acts as a gate insulator for the IGZO TFT 610. The hybrid TFT structure 60 can also include a first passivation layer 670 that has been formed on the second buffer layer 660 and the gate electrode layer 617.

The hybrid TFT structure 60 also includes the source and drain electrodes that have been formed on or disposed in (or through) the interlayer dielectric layer 650, the second buffer layer 660, and first passivation layer 670, e.g., through patterned contact holes, where source and drain electrodes 619 are provided for the IGZO TFT 610 and source and drain electrodes 629 are provided for the LTPS TFTs 620 which contact the source and drain areas of the active layers, e.g., the semiconductor materials.

Then after the hybrid TFT structure 60 is provided, an insulating layer 675 is provided over the first passivation layer 670 and source and drain electrodes 619, 629, where, e.g. LCD display, common electrode 690 is provided on or over the insulating layer 675. The insulating layer 675 could be an organic layer or an inorganic layer. Lastly, a second passivation layer 680 is provided over the insulating layer 675 and common electrode 690 (or pixel electrode), where pixel electrode (or common electrode) 695 is provide on or above the second passivation layer 680 and connected to the source electrode 619 of the IGZO TFT 610. The structure of the LED or OLED display is similar to the first embodiment and omitted here.

Figure 7:
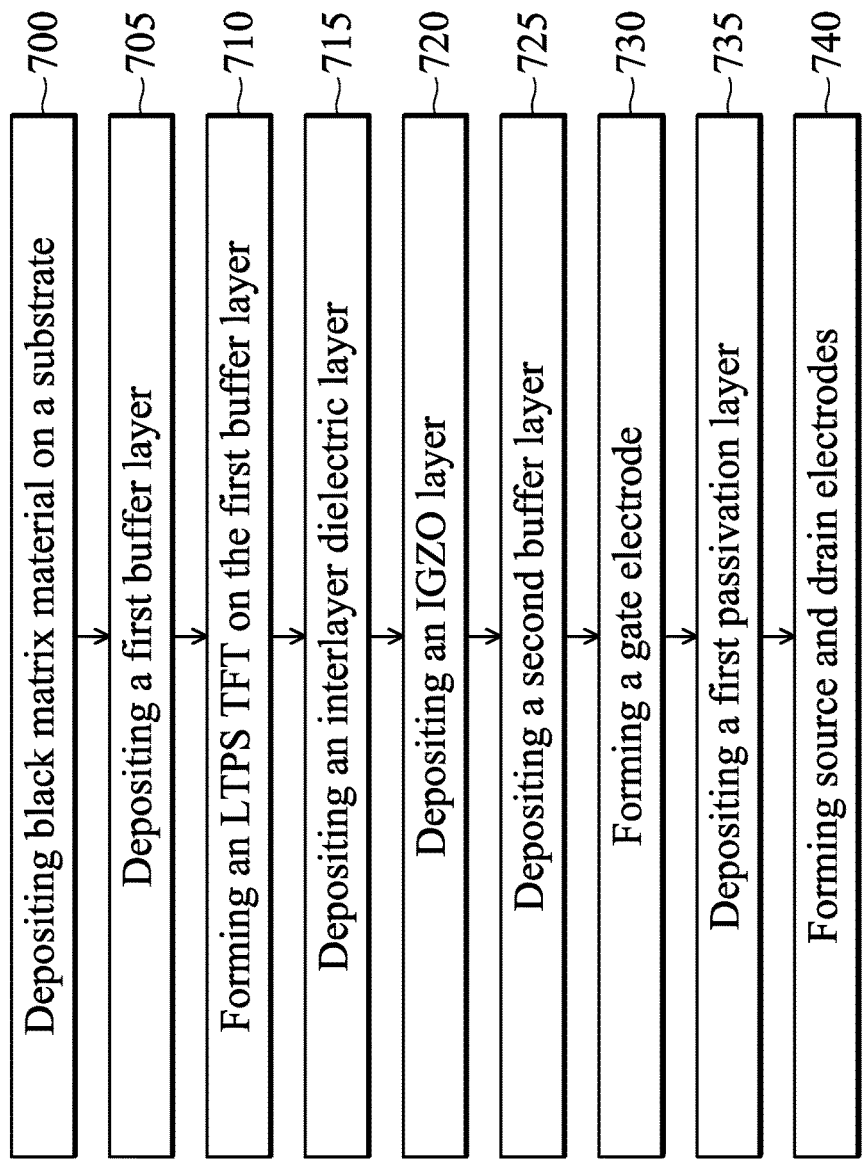
FIG. 7 is a process flow diagram illustrating a method for manufacturing a display device according to the third embodiment of the disclosure.

As seen in FIG. 7, an exemplary method for manufacturing the hybrid TFT structure for the third embodiment with top gate TFT structure is described. In a first step 700, a blanking material is deposited on a substrate to form a black matrix layer, for example, by patterning and forming the black matrix layer in an area of the substrate defined as an IGZO TFT area and at least one LTPS TFT area, e.g., using a depositing and masking process. In a second step 705, the first buffer layer is deposited over the substrate and the black matrix layer, where the first buffer layer can comprise a single layer or multiple layers comprising SiOx and SiNx layers. In the next step, step 710, the LTPS TFT(s) is formed on the first buffer layer and formed in the at least one LTPS TFT area by depositing the LTPS active layer and doping the LTPS active layer to form source and drain areas, where one of the LTPS TFTs is an n-channel TFT and the other LTPS TFT is a p-channel TFT depending on the doping impurity. Then, a gate insulator is deposited over the LTPS active layer, where the gate insulator can comprise SiOx and/or SiNx layers, and depositing a gate electrode over the gate insulator. In another embodiment, a TFT structure with bottom gate (not shown on the figures), a gate electrode is deposited before depositing a gate insulator, and then an active layer is deposited on the gate insulator. In a following step 715, an interlayer dielectric layer is deposited over the first buffer layer and the LTPS TFT. For example, as seen in FIG. 8A, two LTPS TFTs are formed, where one LTPS TFT is an n-channel TFT and the other LTPS TFT is a p-channel TFT, e.g., via doping the LTPS active layer with phosphorus, boron, gallium, arsenic, e.g., group V-VI elements, group IV semiconductors, or the like.

The IGZO semiconductor material is then deposited on the interlayer dielectric layer over the IGZO TFT area in step 720. For example, as seen in FIG. 8B, the IGZO active layer is patterned on the interlayer dielectric layer, e.g., via a photoresist and masking process, so that the IGZO active layer is only formed and deposited in the IGZO TFT area. In step 725, a second buffer layer is deposited over the interlayer dielectric layer and the IGZO active layer, where the second buffer layer comprises at least one oxide material layer that directly contacts the IGZO semiconductor material. The oxide material of the second buffer layer, which can be an SiOx material, has a lower hydrogen concentration that other SiOx or SiNx layer in the hybrid TFT structure, and in particular the second buffer layer has a lower hydrogen concentration than the first buffer layer. For example, the second buffer layer may have a hydrogen concentration of less than 5 atomic percent, in comparison to other SiOx or SiNx layers in the hybrid TFT structure 60 which have a hydrogen concentration of greater than 5 atomic percent, such as 5-10 atomic percent in SiOx layers or 10-20 atomic percent in SiNx layers.

Figure 8C:
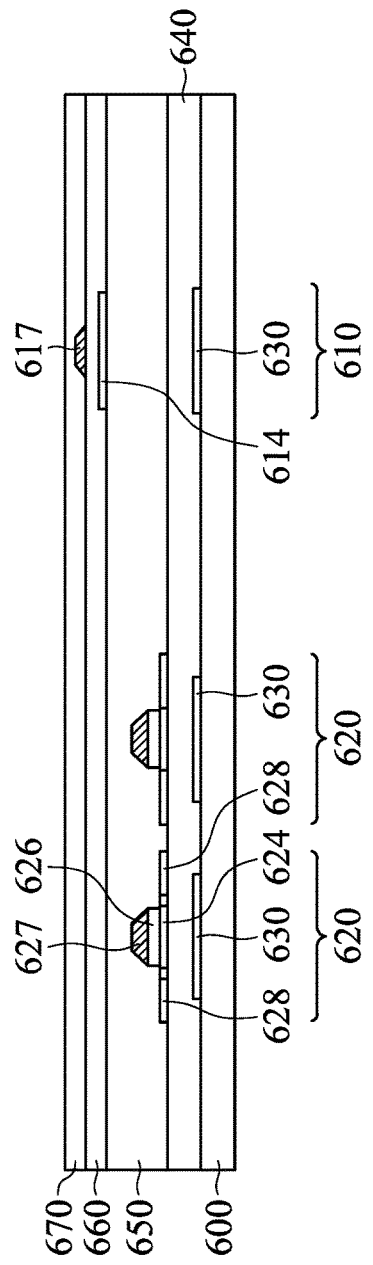

A gate electrode is then formed on the second buffer layer over the IGZO TFT area at step 730 and a first passivation layer is deposited over the gate electrode of the IGZO TFT and the second buffer layer in step 735, for example, as seen in FIG. 8C. The remainder of the hybrid TFT structure 60 is produced in a similar manner as the above embodiments, however, in step 740, the source and drain electrodes are formed in the interlayer dielectric layer, the second buffer layer, and passivation layer.

Figure 8D:
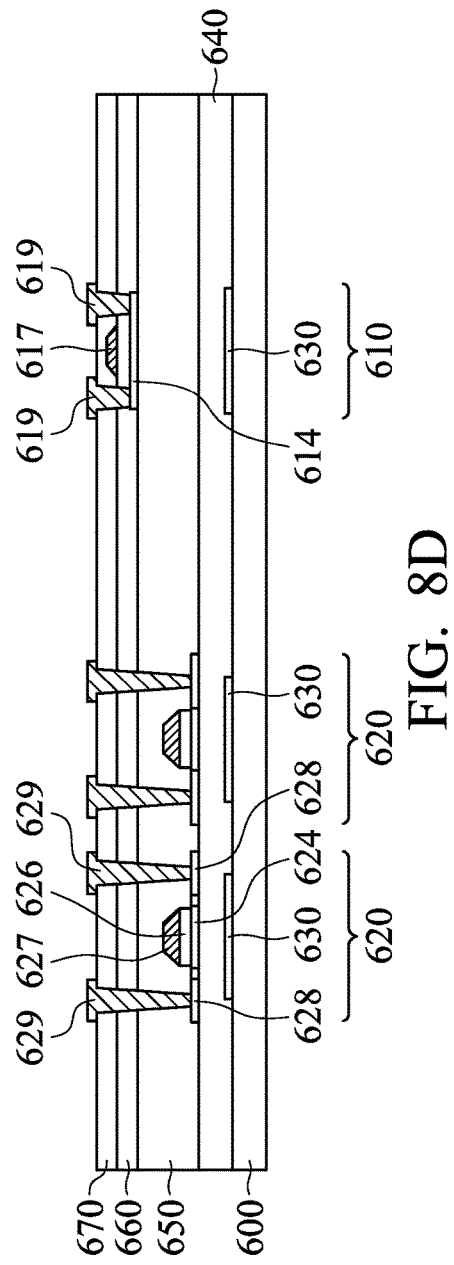

For example, as seen in FIG. 8D, the source and drain electrodes are formed for the IGZO TFT and the two LTPS TFTs, e.g., by forming channels during the deposition steps of the different layers.

Fourth Embodiment

Figure 9:
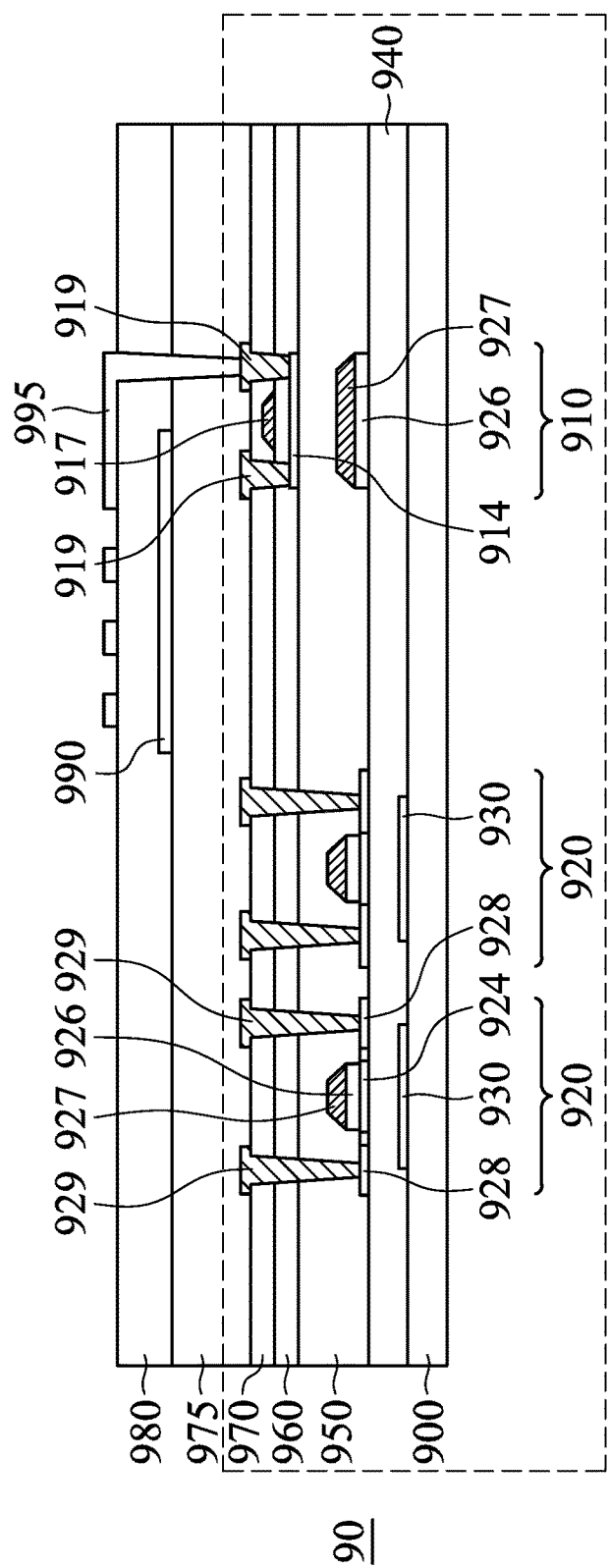
FIG. 9 is a cross-sectional view illustrating the structure of a display device according to a fourth embodiment of the disclosure.

As seen in FIG. 9, a fourth embodiment is illustrated, which is similar to the third embodiment. In this embodiment, however, a blanking layer provided for the IGZO TFT is not part of the black matrix layer disposed on the substrate, but is instead is a part of a LTPS-gate electrode layer that acts as the blanking layer for the IGZO TFT, e.g., to block light. That is, in this embodiment the blanking layer for the IGZO TFT and the gate electrode of LTPS TFT are formed by the same process or have the same material.

That is, in this embodiment, the blanking material is disposed on the substrate 900 to form a black matrix layer 930 only below the LTPS TFTs 920. Specifically, the hybrid TFT structure 90 includes a first buffer layer 940 disposed over the black matrix layer 930 and the substrate 900, where the first buffer layer 940 can comprise a single layer or multiple sublayers comprising SiOx and SiNx layers, and in one embodiment, a first sublayer comprising a SiOx layer, a second sublayer comprising a SiNx layer, and third sublayer over the second sublayer comprising a SiOx layer. On the first buffer layer 940, the LTPS TFT 920 includes the LTPS active layer 924 that has been formed or deposited on the buffer layer 940 and doped to have a source area and a drain area 928. The LTPS TFT 920 also includes the gate insulator 926 and the gate electrode 927 that have been formed or deposited over the LTPS active layer 924 in each LTPS TFT. In this embodiment, one of the LTPS active layers 924 is doped to form an n-channel TFT and the other LTPS active layer 924 is doped to form a p-channel TFT for driving the pixel of the display. Additionally, on the first buffer layer 940, the materials for the LTPS gate insulator 926 and gate electrode 927 are also formed and/or deposited below the IGZO TFT 910 and act as a blanking layer for the IGZO TFT 910.

The hybrid TFT structure 90 also includes an interlayer dielectric layer 950 that has been formed or deposited across the entire structure, e.g., the buffer layer 940, the IGZO TFT 910 and the LTPS TFT(s) 920. The interlayer dielectric layer 950 can be a single layer or a multilayer structure, where if the interlayer dielectric layer 950 has multiple layers, the top layer comprises SiOx and the bottom layer comprises SiNx.

The IGZO TFT includes an IGZO active layer 914 that has been disposed on or over the interlayer dielectric layer 950, where a second buffer layer 960 has been disposed on the interlayer dielectric layer 950 and the IGZO active layer 914. The second buffer layer 960 can be a single layer or multilayer structure comprising at least a SiOx layer and an additional SiOx and/or SiNx layer. As in the above embodiments, the second buffer layer 960 (or sublayer) directly adjacent to (e.g., over) the IGZO active layer 914 is an oxide layer that has a lower hydrogen concentration than other SiOx or SiNx layers in the hybrid TFT structure 90, and in particular the second buffer layer 960 has a lower hydrogen concentration than the first buffer layer 940. The IGZO TFT 910 further includes the gate electrode 917 formed on the second buffer layer 960 over the IGZO active layer 914, where the second buffer layer 960 is (acts as) the gate insulator in this embodiment. The hybrid TFT structure 90 can also include the first passivation layer 970 that has been formed on the second buffer layer 960 and the gate electrode 917.

The remainder of the hybrid TFT structure 90 has similar features as in the third embodiment and will not be explained further in detail herein.

The method for manufacturing the hybrid TFT structure 90 for the fourth embodiment has similar steps as in the third embodiment. However, in the third step of forming the LTPS TFT on the buffer layer, the LTPS gate insulator and gate electrode are also formed below the IGZO TFT to act as the blanking layer for the IGZO TFT. The LTPS gate insulator and gate electrode can be formed and/or deposited using similar processes as discussed above, for example, a photoresist and masking process along with a deposition process.

Fifth and Sixth Embodiments

Figure 10:
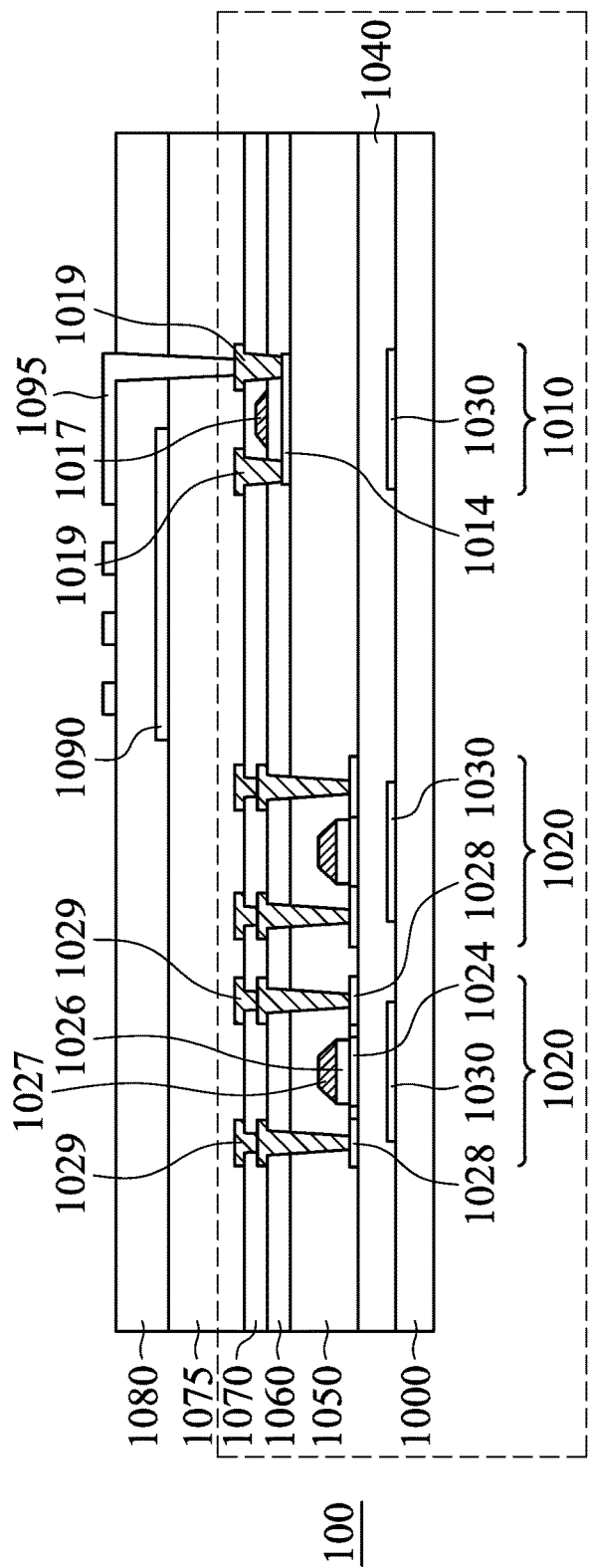
FIGS. 10 and 11 show cross-sectional views illustrating the structure of a display device according to a variant of the third embodiment of the disclosure.
Figure 11:
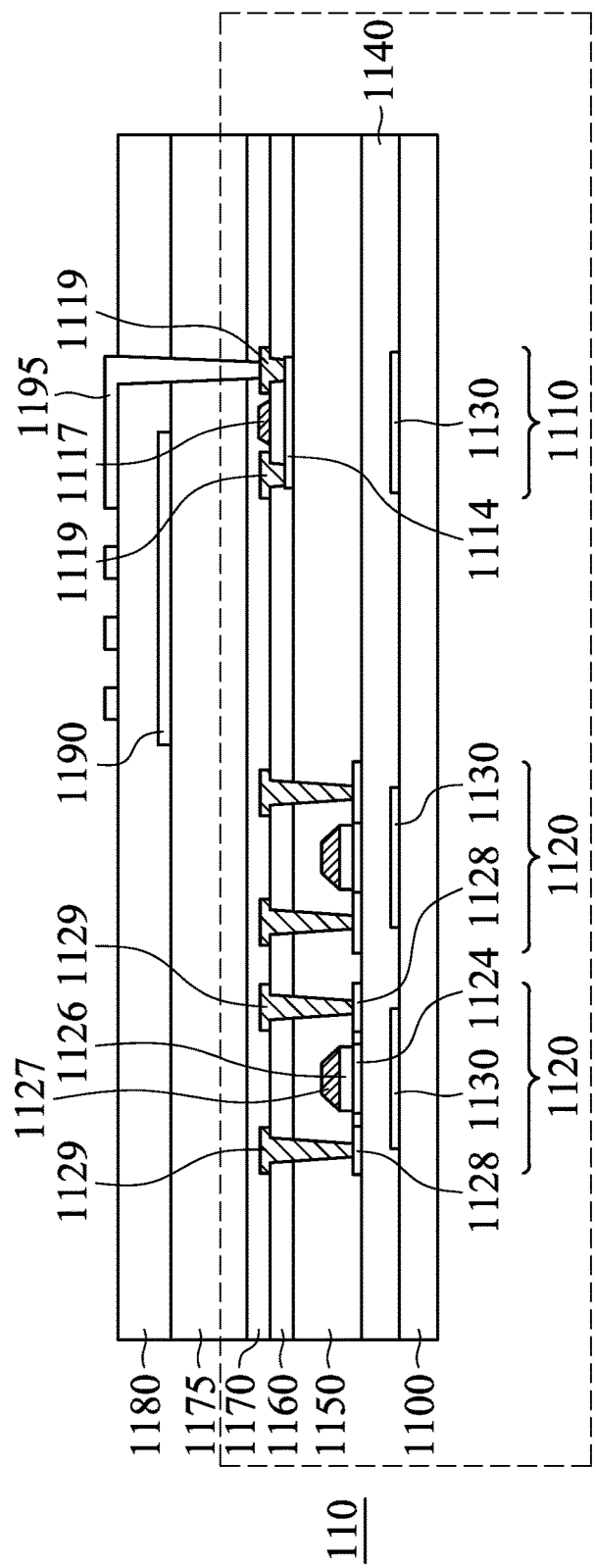

As seen in FIGS. 10 and 11, fifth and sixth embodiments are illustrated, which are similar to the third embodiment of the disclosure. In these embodiments, however, the deposition and/or etching of the source and drain electrodes for the LTPS TFT(s) and the IGZO TFT are modified at least in part during the deposition of the gate electrode for the IGZO TFT.

For example, the fifth embodiment, illustrated in FIG. 10, illustrates a hybrid TFT structure having a similar IGZO TFT 1010 and LTPS TFT 1020 as in the third embodiment, where the common components will not be discussed in detail. Rather, as seen in FIG. 10, the LTPS TFT 1020 includes the source and drain electrodes 1029 having at least a first part and a second part, where the first part and the second part of the source and drain electrodes are formed of different materials. For example, the first part of the source and drain electrodes can be formed along with (and/or the same material as) the gate electrode 1017 of the IGZO TFT 1010 on the second buffer layer 1060 during the same depositing and masking step. The IGZO TFT 1010 includes the source and drain electrodes 1019 which have been formed in the same manner as in the previous embodiments, as discussed above, through the passivation layer 1070, while the second part of the source and drain electrodes 1029 of the LTPS TFTs 1020 are also formed during the deposition and masking step having the same material as the source and drain electrodes 1019 of the IGZO TFT 1010.

After the hybrid TFT structure 100 is provided, an insulating layer 1075 is formed over the passivation layer and source and drain electrodes of the IGZO TFT 1010 and the LTPS TFTs 1020. The insulating layer 1075 could be an organic layer or an inorganic layer. It is appreciated that channels connecting the source and drain electrodes to the source and drain areas of the semiconductor material can be formed by masking and/or etching the different layers.

As seen in FIG. 11, in the sixth embodiment, the hybrid TFT structure 110 has similar features as the third embodiment having the IGZO TFT 1110 and the LTPS TFT(s) 1120. In this embodiment, however, the gate electrodes 1117 of the IGZO TFT 1110 can be made from the same material as the gate and source electrodes 1119 and 1129. In so doing, such features can simplify the manufacturing steps since the gate electrodes 1117, which is formed and or deposited on the second buffer layer 1160, can be deposited in the same deposition and masking step as the source and drain electrodes for the IGZO TFT 1110 and the LTPS TFT (s) 1120.

Seventh Embodiment

Figure 12G:
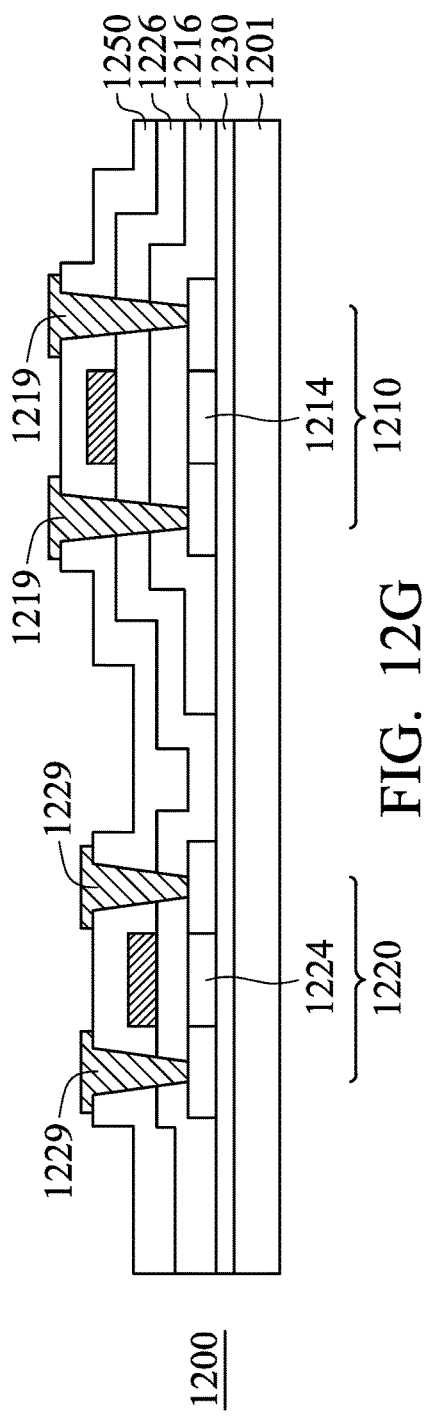

In the seventh embodiment of the disclosure, another embodiment of the hybrid TFT structure 1200 is provided, where the SiOx layer having the lower hydrogen concentration, e.g., less than or equal to 5 atomic percent, and, in one embodiment, less than or equal to 3 atomic percent, is provided in at least the gate insulator in the IGZO TFT contacting the IGZO active layer, as seen in FIGS. 12A-12L. For example, as shown in FIG. 12A, the hybrid TFT structure 1200 includes an IGZO TFT 1210 and an LTPS TFT 1220, where additional TFTs can be provided (not shown). While a blanking layer, such as a black matrix layer, is not shown in this embodiment, it is to be understood that the blanking layer to block light, as discussed in the above embodiments, can also be included.

In the embodiment shown in FIG. 12A, the hybrid TFT structure 1200 includes the substrate 1201 and buffer layer 1230, as discussed in previous embodiments, having at least one (in this embodiment, the number of the LTPS TFT is two, but is not limited thereto) LTPS TFT and an IGZO TFT. As in the previous embodiments, the LTPS TFT includes the LTPS active layer 1224, that was deposited and formed on the buffer layer 1201, e.g., using a photoresist and masking process, and the source and drain electrodes that are connected to the source and drain areas, e.g., contact areas, on the LTPS active layer. The LTPS TFT also includes a gate insulator 1226, which can be deposited and formed over the LTPS active layer, and a gate electrode 1228. The IGZO TFT includes an IGZO active layer 1214, e.g., IGZO semiconductor material, source/drain electrodes connected to the contact (source and drain) areas on the IGZO active layer 1214, the gate insulator 1216 that has been deposited and formed over the active layer 1214, and a gate electrode 1218. In this embodiment, each of the gate insulator 1216 and the gate insulator 1226 comprise at least one silicon oxide layer, where the gate insulator 1216 of the IGZO TFT 1210 has an oxide film having a lower hydrogen concentration, e.g., concentration of less than 5 atomic percent (preferably less than 3 atomic percent), than the gate insulator 1226 in the LTPS TFT 1220, e.g., having a hydrogen concentration greater than 5 atomic percent. Additionally, in some embodiments, the gate insulator 1216 of the IGZO TFT 1210 has a higher film density (i.e., etching rate is lower) than the gate insulator 1226 of the LTPS TFT 1220. As seen in FIG. 12A, the gate insulator 1216 in the IGZO TFT does not overlap the gate insulator 1226 in the LTPS TFT, which can be formed using different photoresist and masking processes, where the gate insulator 1216 of the IGZO TFT 1210 may not entirely etch off. While not limiting the manufacturing process, in one embodiment, the gate insulator 1226 is formed in the LTPS TFT 1220 before forming (and/or depositing) the gate insulator 1216 in the IGZO TFT 1210. In another embodiment with a bottom gate TFT structure, not shown on the figures, the gate electrode is formed before the gate insulator, and then the active layer is formed on the gate insulator.

The hybrid TFT structure 1200 also includes an interlayer dielectric layer 1250 that has been deposited and formed over the IGZO TFT 1210 and the LTPS TFT 1220. The interlayer dielectric layer 1250 can be formed from a single layer of SiOx or a multilayer structure having a top layer of SiOx and bottom layer of SiNx.

In an alternative embodiment of this disclosure, as seen in FIG. 12B, while the IGZO TFT 1210 has similar features as the IGZO TFT of FIG. 12A, the LTPS TFT 1220 in this embodiment has different features than the LTPS TFT of FIG. 12A. For example, the LTPS TFT 1220 has the gate insulator 1226 formed over or on the LTPS active layer 1224, and the gate electrode 1228 formed over or on the gate insulator 1226, and additionally has a first interlayer dielectric layer 1240 formed over the gate electrode 1228, e.g., the first interlayer dielectric layer 1240 is not included in the IGZO TFT, and may be disposed only in the LTPS TFT. The first interlayer dielectric layer 1240 can be formed from a single layer of SiNx or multiple layers of combinations of SiOx and SiNx layers. The hybrid TFT structure 1200 then includes the interlayer dielectric layer 1250 that is formed over the first interlayer dielectric layer 1240 in the LTPS TFT 1220 and the IGZO TFT 1210. That is, in this embodiment, the gate insulator of the IGZO TFT does not overlap on the LTPS TFT and the interlayer dielectric SiNx layer is only included in the LTPS TFT.

In a variation of this embodiment, as seen in FIG. 12C, the LTPS TFT 1220 comprises the LTPS active layer 1224, a gate insulator 1226 formed on or over the LTPS active layer 1224, and a gate electrode 1228 formed over the gate insulator 1226. The IGZO TFT 1210 comprises the IGZO active layer 1214 formed over the buffer layer 1230, the gate insulator 1216 formed over (and/or around) the IGZO active layer 1214 and over the buffer layer 1230 in the IGZO TFT 1210, but does not overlap the LTPS TFT 1220 in this embodiment, a second gate insulator 1217 formed over the gate insulator 1216, which overlaps with the gate insulator 1226 of the LTPS TFT 1220, and the gate electrode 1218 formed over the second gate insulator 1217 and the IGZO active layer 1214. As in the previous embodiments, the gate insulator 1216, which is adjacent to the IGZO active layer 1214 has an oxide layer that has a lower hydrogen concentration than other SiOx or SiNx layers of the hybrid TFT structure, and the gate insulator 1216 has a lower hydrogen concentration than the second gate insulator 1217, the gate insulator of the LTPS TFT and/or the buffer layer, e.g., less than 5 atomic percent and preferably less than 3 atomic percent. Then, the interlayer dielectric layer 1250 is formed over the LTPS TFT 1220 and the IGZO TFT 1210.

In another variant of this embodiment, as seen in FIG. 12D, the LTPS TFT 1220 and the IGZO TFT 1210 are similar to the structures illustrated in the embodiment shown in FIG. 12A, except that the gate insulator 1226 of the LTPS TFT 1220 overlaps or covers the LTPS TFT 1220 and is below or under the IGZO TFT 1210. In so doing, the hybrid TFT structure 1200 includes the IGZO TFT 1210 that is formed and/or deposited on the gate insulator 1226 of the LTPS TFT 1220. That is the gate insulator 1216 of the IGZO TFT does not overlap the LTPS TFT, but the gate insulator 1226 of the LTPS TFT is beneath or below the IGZO TFT.

FIG. 12E shows another variant, which is similar to the embodiment illustrated in FIG. 12B, but the gate insulator 1216 of the IGZO TFT 1210 is formed only on (or above) the IGZO active layer 1214. While the LTPS TFT 1220 has a first interlayer dielectric layer 1240 comprising a SiNx layer formed over the LTPS TFT 1220, a SiOx interlayer dielectric layer 1250 is formed over both the LTPS TFT 1220 and the IGZO TFT 1210. In this embodiment, the gate insulator 1216 of the IGZO TFT 1210 has a lower hydrogen concentration than the interlayer dielectric layer 1250 as well as the first interlayer dielectric layer 1240 in the LTPS TFT 1220. In other words, the SiNx interlayer dielectric layer is only included on the LTPS TFT, while the SiOx interlayer dielectric layer overlaps both the LTPS TFT and the IGZO TFT.

FIG. 12F shows yet another variant of this embodiment that includes the blanking layer as a black matrix layer 1235 formed on the substrate 1201 below the LTPS TFT 1220 and the IGZO TFT 1210. In this embodiment, the hybrid TFT structure includes the buffer layer 1230 that is formed on the substrate and over the black matrix layer 1235, where the LTPS TFT and the IGZO TFT are formed on the buffer layer 1230. The hybrid TFT structure also includes a SiOx insulator layer 1216 that is disposed across the entire LTPS TFT and the IGZO TFT. Then the LTPS TFT 1220 also includes a second gate insulator 1227 comprising a SiNx layer that has been formed over the LTPS active layer 1224 in the LTPS TFT 1220 and the gate electrode 1228 that has been formed on the second gate insulator 1227. In the IGZO TFT 1210, the IGZO TFT includes the gate electrode 1218 that has been formed on the SiOx insulator layer 1216 over the IGZO active layer. The hybrid TFT structure then includes the interlayer dielectric layer 1250 comprising a SiOx layer that has been formed over the LTPS TFT 1220 and the IGZO TFT 1210. As in other embodiments, the buffer layer 1230 can comprise a single layer or multiple layers of SiNx and SiOx layers, where a SiOx layer is adjacent the IGZO active layer 1214. In other words, the SiNx gate insulator is only a part of the LTPS TFT, e.g., only on the LTPS area or region.

As seen in FIG. 12G, another embodiment of the hybrid TFT structure is illustrated where the gate insulator 1226 of the LTPS TFT 1220 overlaps onto and over the IGZO TFT 1210. In this embodiment, the LTPS TFT 1220 includes the LTPS active layer 1224 in the LTPS area and the IGZO TFT 1210 includes the IGZO active layer 1214 in the IGZO area deposited on the buffer layer 1201. Then the IGZO TFT includes the gate insulator 1216 that is disposed over (and around) the IGZO active layer 1214 and the LTPS TFT includes the gate insulator 1226 that is deposited over the LTPS active layer 1224 in the LTPS TFT area and the gate insulator 1216 in the IGZO TFT area (without patterning). The hybrid TFT structure further includes the interlayer dielectric layer 1250 that is disposed and/or deposited over the gate insulator 1216, where the interlayer dielectric layer 1250 can comprise a top layer of SiOx and a bottom layer of SiNx.

Figure 12H:
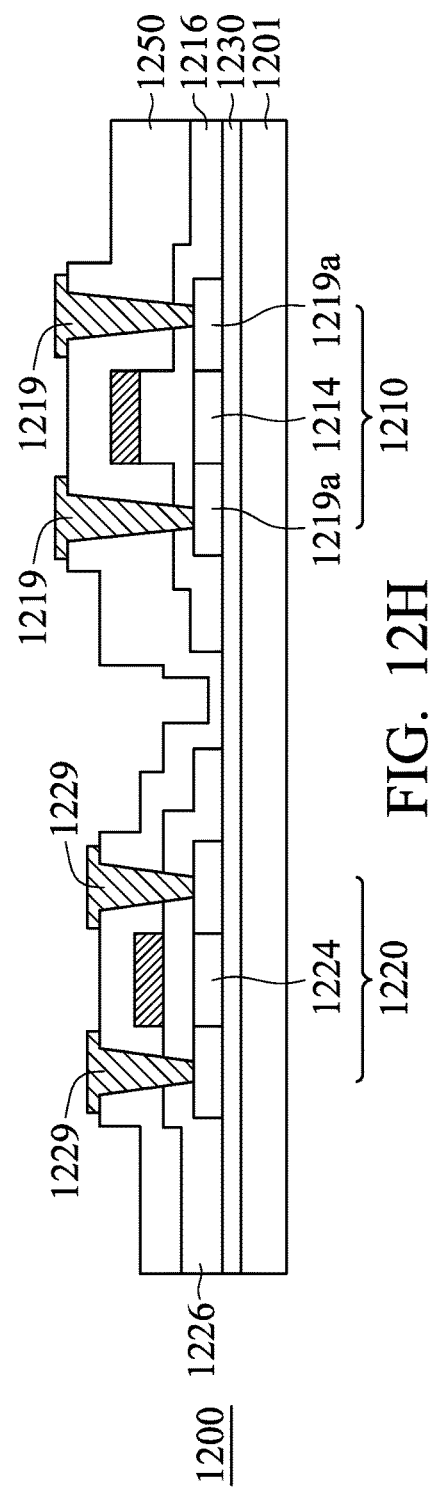

FIG. 12H illustrates another embodiment of the disclosure, where the hybrid TFT structure has the LTPS TFT 1220 including the gate insulator 1226 that is formed in the LTPS TFT area before the formation of the gate insulator 1216 for the IGZO TFT 1210, where the gate insulator 1226 does not overlap on the IGZO TFT 1210. As seen in FIG. 12H, the gate insulator 1216 of the IGZO TFT 1210 at the source and drain areas 1219a has a reduced (i.e., smaller) thickness, e.g., 500-1000 Angstroms, than the thickness of the gate insulator 1216 above a part of the IGZO active layer 1214, e.g., thickness of 1000-5000 Angstroms. It is appreciated that such a thinning of the gate insulator at the source and drain areas 1219a favors the conductorization process for the formation of the source and drain areas of the IGZO active layer.

Figure 12I:
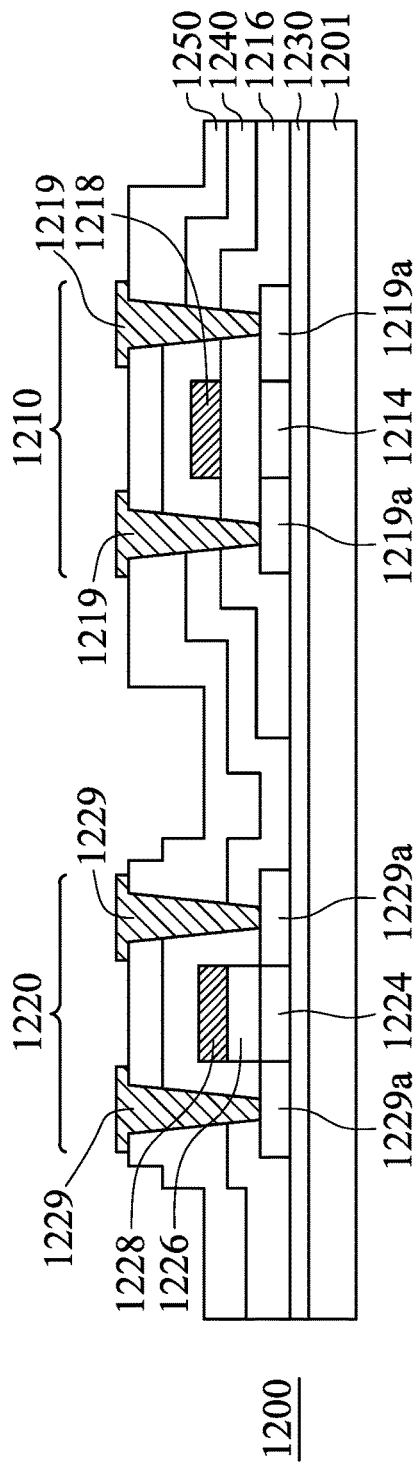

In another embodiment of the disclosure, as seen in FIG. 12I, the LTPS TFT 1220 and the IGZO TFT 1210 are formed on the buffer layer in the LTPS TFT area and the IGZO TFT area, respectively. The hybrid TFT structure includes a first interlayer dielectric layer 1240, which comprises a SiNx layer, that is disposed over the LTPS TFT area or region and the IGZO TFT area or region, where the gate insulator 1216 is disposed over the IGZO active layer 1214 including the source and drain areas 1219a. The hybrid TFT structure then includes the interlayer dielectric layer 1250, which comprises a SiOx layer, which is disposed over the first interlayer dielectric layer 1240.

Figure 12J:
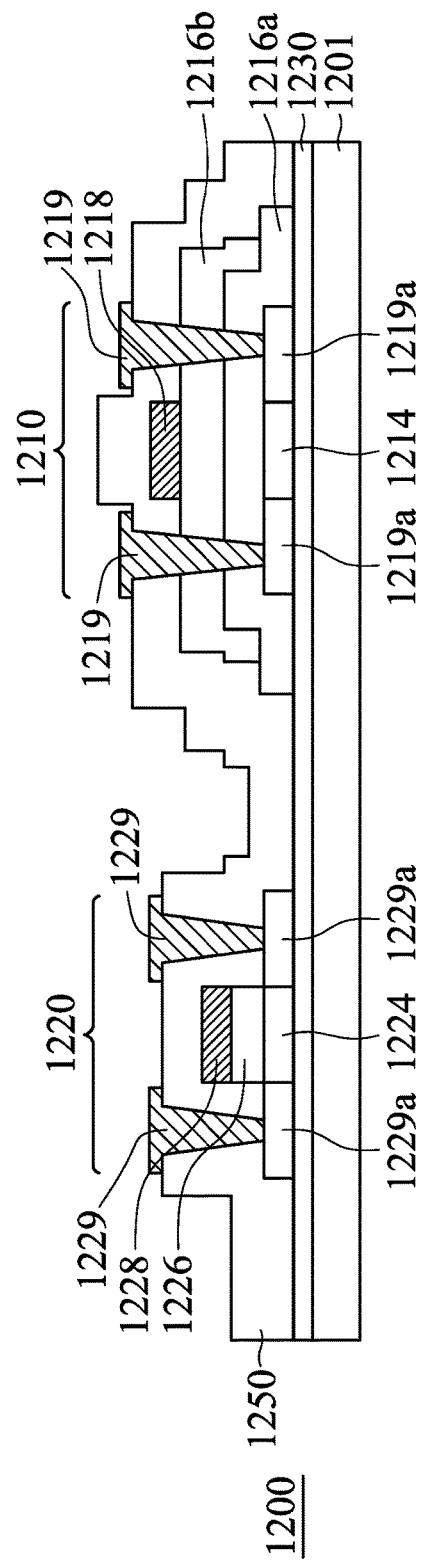

In a variant of the embodiment shown in FIG. 12C, FIG. 12J illustrates a hybrid TFT structure having an LTPS TFT 1220 with similar features as the LTPS TFT 1220 as illustrated in FIG. 12C. In this variant, however, the IGZO TFT 1210 includes two gate insulators to further protect the IGZO active layer. Specifically, as seen in FIG. 12J, the IGZO TFT 1210 includes, after the IGZO active layer 1214 has been disposed on the buffer layer in the IGZO TFT area or region, a first gate insulator 1216a that is disposed on or over the IGZO active layer 1214. Then a second gate insulator 1216b is disposed over at least a partial portion (or the entirety thereof) of the first gate insulator 1216a, where the second gate insulator 1216b overlaps with the gate insulator 1226 of the LTPS TFT 1220. The first and the second gate insulators 1216a, 1216b can have a substantially uniform thickness over the entirety of the IGZO active layer 1214. The IGZO TFT also includes a gate electrode 1218 that is formed on the second gate insulator 1216b, e.g., over a portion of the IGZO active layer. Finally, the hybrid TFT structure includes the interlayer dielectric layer 1250, which can comprise a top layer of SiOx and a bottom layer of SiNx, that is formed over the IGZO TFT area and LTPS TFT area.

Additionally, as seen in FIG. 12K, the IGZO TFT can have the second gate insulator 1216b be thinned to have a thicker region over a part of the IGZO active layer corresponding to the gate electrode of the IGZO TFT and thinner regions over the source and drain areas 1219a of the active layer. Such a second gate insulator can be formed through a thinning process, as known in the art, during the deposition step or after the second gate insulator has been deposited, e.g., chemical etching. FIG. 12L shows another embodiment, where the second gate insulator 1216b has been formed or deposited over the first gate insulator 1216a over the IGZO active layer 1214. In this embodiment, the first gate insulator 1216a has a greater thickness over a part of the IGZO active layer 1214 corresponding to the gate electrode of the IGZO TFT and thinner regions over the source and drain areas 1219a. The first gate insulator 1216a can be formed from known methods for thinning the gate insulator after the gate electrode has been formed over the first and second insulators, such as plasma-etching the gate insulator while using the already-formed gate electrode as hard mask, to protect/prevent the gate insulator below the gate electrode from being etched/thinned. It is appreciated that such a hard masking process using the gate electrode as the mask can be used in any of the identified embodiments for forming the gate insulator and during the thinning processes.

Figure 13A:
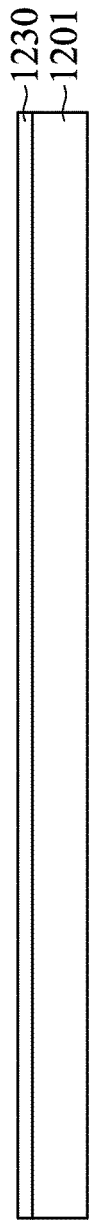
Figure 13B:
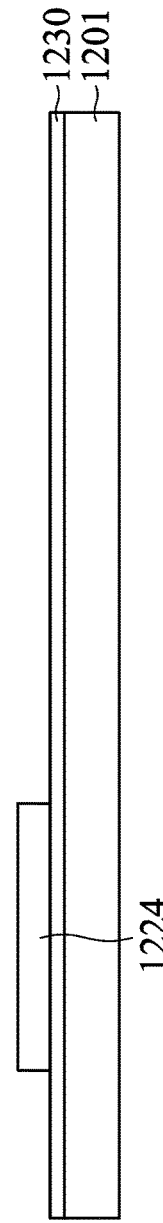
Figure 13C:
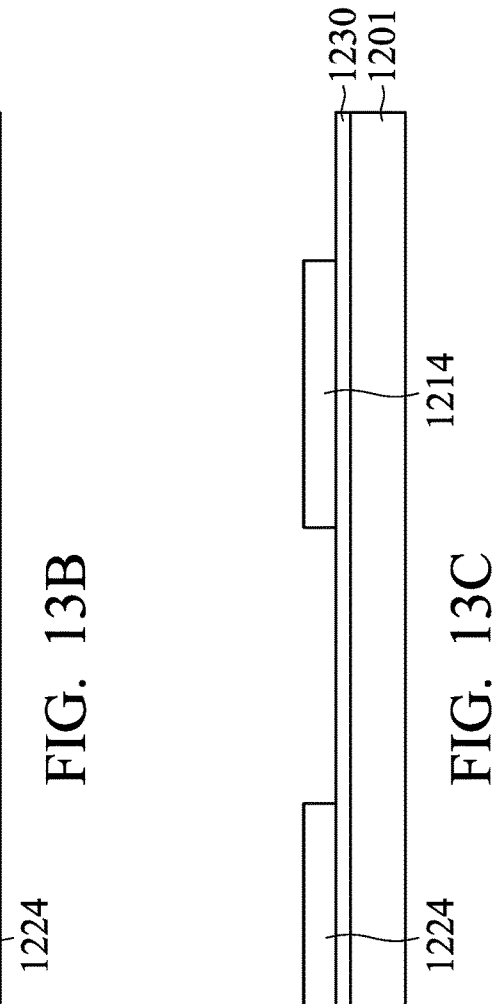

One method for manufacturing the hybrid TFT structure of FIG. 12A will now be discussed with reference to FIGS. 13A-13L. In a first step, as seen in FIG. 13A, a buffer layer 1230 is deposited on a substrate 1201. In a subsequent step as seen in FIG. 13B, the LTPS active layer 1224 is deposited and patterned in the LTPS TFT area. In the step illustrated in FIG. 13C, the IGZO active layer 1214 is then deposited and patterned in the IGZO TFT area. Then the gate insulator 1216 is deposited and patterned over the IGZO active layer 1214 in the IGZO TFT area, as seen in FIG. 13D. As seen in FIG. 13E, the gate insulator 1226 is then deposited and patterned over the LTPS active layer 1224 in the LTPS TFT area. After disposing the gate insulators, the metal layer of the gate electrode is deposited and patterned using a photoresist over the respective active layers in the LTPS TFT area and the IGZO TFT area, as illustrated in FIG. 13F. FIG. 13G then illustrates the doping of the impurities in the LTPS active layer to form the source and drain areas, e.g., regions, for the LTPS TFTs, e.g., for forming an n-channel or p-channel TFT. For example, by doping the LTPS active layer with phosphorus, boron, gallium, arsenic, e.g., group V-VI elements, group IV semiconductors, or the like.

In a following step, as seen in FIG. 13H, the gate insulator 1216 in the IGZO TFT area can be thinned using an etching process and conductorization, e.g., by H2 or Ar or N2 plasma treatment, to define the source and drain areas for the IGZO TFT, where the region over a part of the IGZO active layer 1214 corresponding to the gate electrode is thicker than the thinned regions over the source and drain areas of the active layer. It is appreciated that the source and drain areas of the IGZO active layer can be formed by conductorization, plasma treatment, dry etching, or made from aluminum, titanium, molybdenum, copper, copper-manganese alloy, or a combination thereof.

The interlayer dielectric layer 1250 is then deposited and patterned over the gate insulators and gate electrodes, as illustrated in FIG. 13I, where contact holes(or through holes) are formed during the deposition and patterning processes. As seen in FIG. 13J, the source and drain electrodes 1219, 1229 are deposited and patterned for the LTPS TFT and the IGZO TFT, where the source and drain electrodes connect to the source and drain areas in the respective TFT.

Figure 13K:
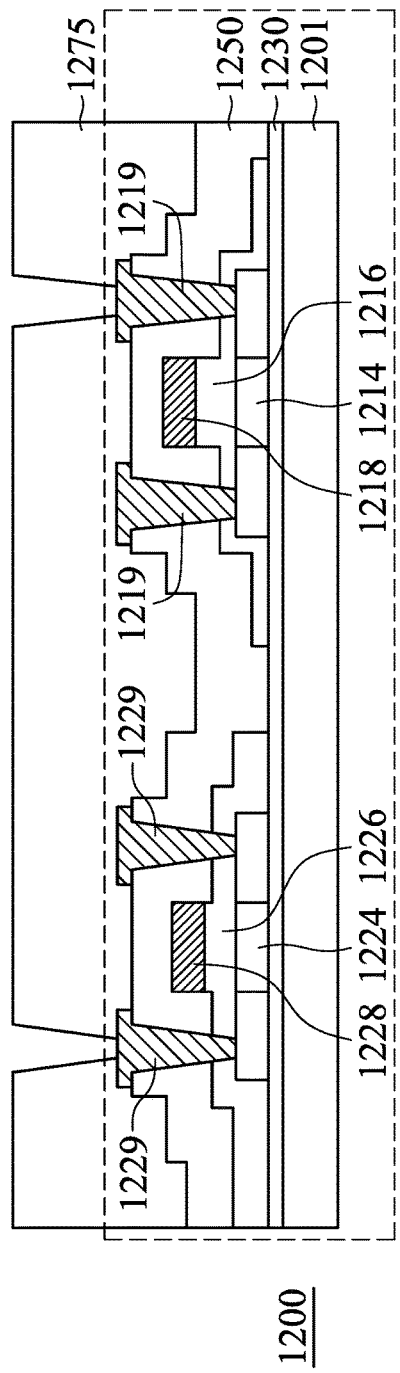
Figure 13L:
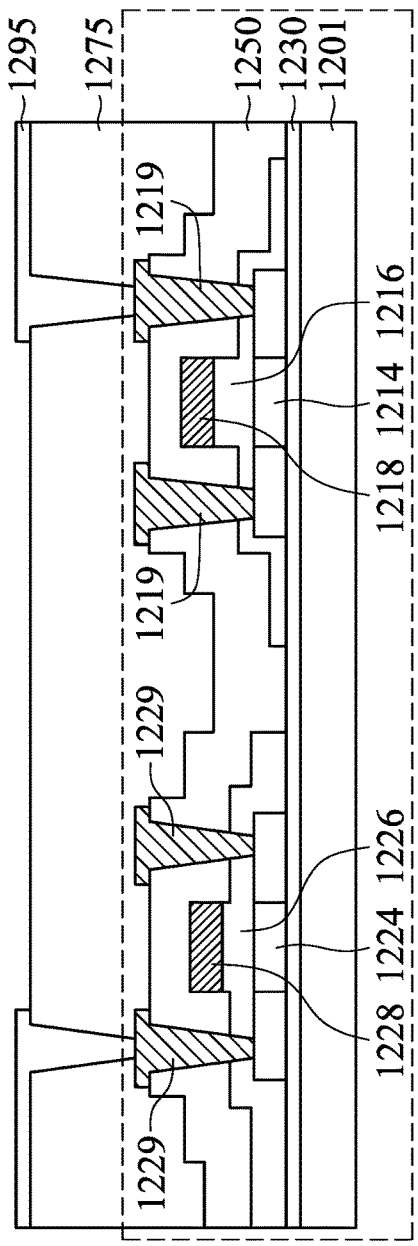

After a hybrid TFT structure 1200 is provided, a passivation layer 1275 can then be deposited and patterned over the source and drain electrodes and the interlayer dielectric layer, where contact holes are formed in the passivation layer 1275 to connect to the source and/or drain electrodes of the TFTs, as seen in FIG. 13K. Finally, as seen in FIG. 13L, the pixel electrodes 1295 can then be deposited and patterned over and through the passivation layer to electrically connect to the source/drain electrode of the LTPS TFT and the source/drain electrode of the IGZO TFT.

Figure 14A:
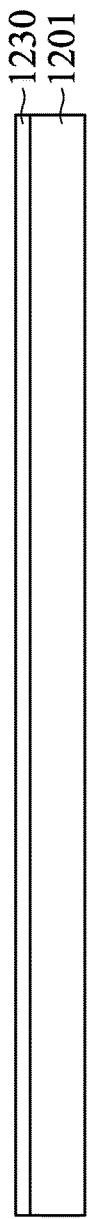
Figure 14B:
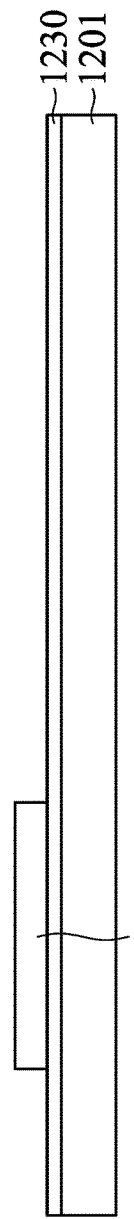
Figure 14C:
Figure 14D:
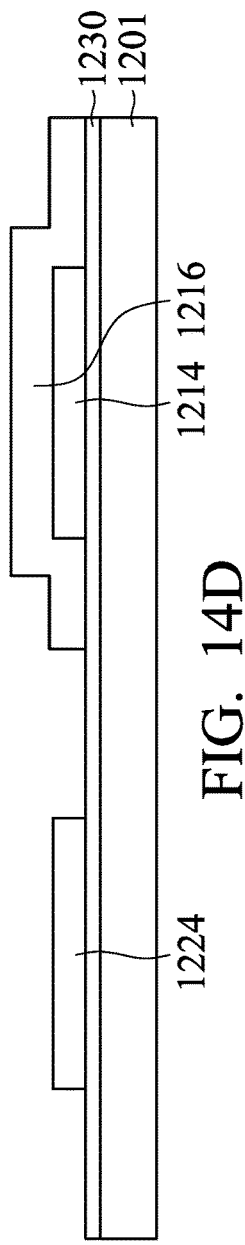
Figure 14E:
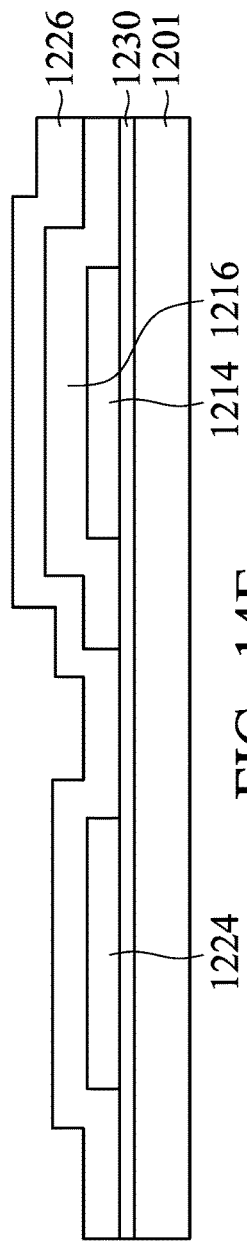
Figure 14F:
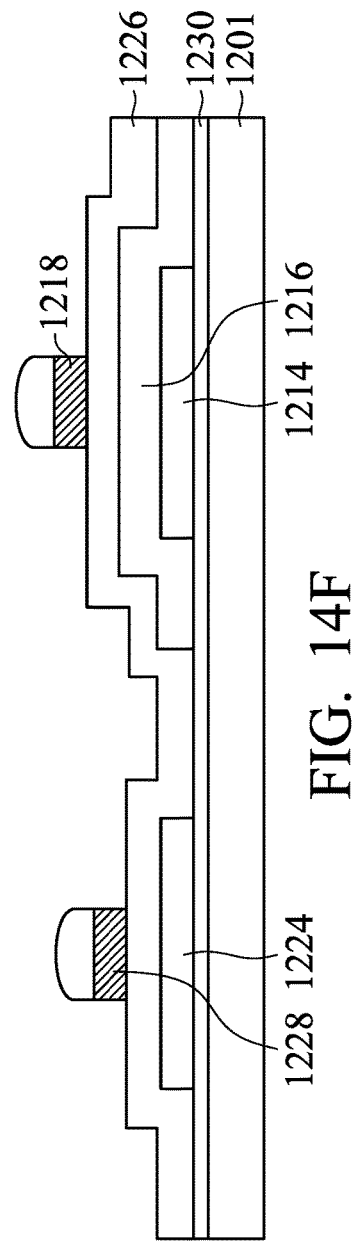

A method is also disclosed for manufacturing the hybrid TFT structure of FIG. 12C as discussed with reference to FIGS. 14A-14L. In a first step, as seen in FIG. 14A, a buffer layer 1230 is deposited on a substrate 1201. In a subsequent step as seen in FIG. 14B, the LTPS active layer 1224 is deposited and patterned in the LTPS TFT area on the buffer layer. In the step illustrated in FIG. 14C, the IGZO active layer 1214 is then deposited and patterned in the IGZO TFT area on the buffer layer. Then the gate insulator 1216 is deposited and patterned over the IGZO active layer in the IGZO TFT area, as seen in FIG. 14D. Then, as seen in FIG. 14E, the gate insulator 1226 is deposited and patterned over the LTPS active layer in the LTPS TFT area as well as over the gate insulator in the IGZO TFT area. After which, the gate electrode is deposited and patterned over the respective active layer in the LTPS TFT area and the IGZO TFT area using a photoresist process, as illustrated in FIG. 14F. FIG. 14G then illustrates the doping of the impurities in the LTPS active layer to define the source and drain areas, e.g., regions, for the LTPS TFT(s), e.g., for forming an n-channel or p-channel TFT, along with the patterning and thinning of the gate insulator. As seen in FIG. 14G, the gate insulator 1226 for the LTPS TFT and the gate insulator 1217 for the IGZO TFT are etched and the first gate insulator 1216 over the IGZO active layer is kept and may be thinned, e.g., using the gate electrode as a hard mask during a hard masking process, where the gate insulator over a part of the IGZO active layer corresponding to the gate electrode is thicker than the areas or regions over the source and drain areas. As seen in FIG. 14H, a conductorization process is used to form the source and drain areas of the IGZO active layer.

In a following step, as seen in FIG. 14I, the interlayer dielectric layer 1250 is then deposited and patterned over the gate insulators and gate electrodes, where contact holes are formed during the deposition and patterning processes. As seen in FIG. 14J, the source and drain electrodes 1219, 1229, respectively, are deposited and patterned for the LTPS TFT and the IGZO TFT, where the source and drain electrodes electrically connect to the source and drain areas in the respective TFT. After the hybrid TFT structure 1200 is provided, a passivation layer 1275 can then be deposited and patterned over the source and drain electrodes 1219/1229 and the interlayer dielectric layer 1250, where contact holes are formed in the passivation layer to connect to the source and/or drain electrodes of the TFTs, as seen in FIG. 14K. Finally, as seen in FIG. 14L, the pixel electrodes can then be deposited and patterned over and through the passivation layer to connect to the source/drain electrode of the LTPS TFT and the source/drain electrode of the IGZO TFT.

Figure 15A:
Figure 15B:
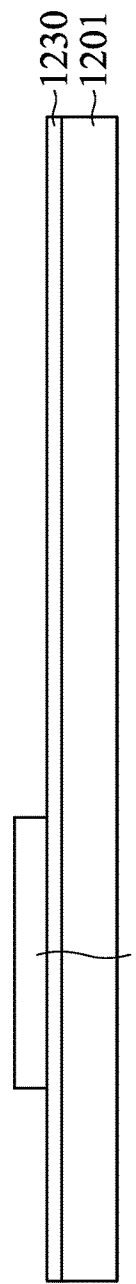
Figure 15C:
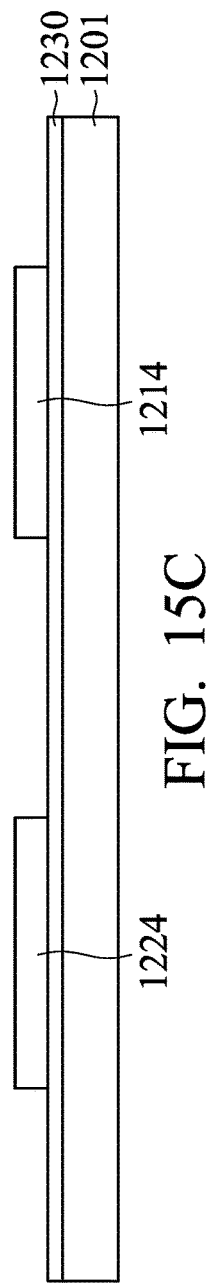

The method for manufacturing the hybrid TFT structure of FIG. 12E will now be discussed with reference to FIGS. 15A-15M. In a first step, as seen in FIG. 15A, a buffer layer 1230 is deposited on a substrate 1201. In a subsequent step as seen in FIG. 15B, the LTPS active layer is deposited and patterned in the LTPS TFT area, while the IGZO active layer is deposited and patterned in the IGZO TFT area, as seen in FIG. 15C. Then the gate insulator 1216 is deposited and patterned over the IGZO active layer in the IGZO TFT area, as seen in FIG. 15D and the gate insulator 1226 is deposited and patterned over the LTPS active layer in the LTPS TFT area, as illustrated in FIG. 15E. While the gate insulator for the LTPS TFT and the IGZO TFT can be formed from the same material, in this embodiment, the gate insulators are formed from different materials, e.g., the gate insulator for the IGZO TFT can comprise an oxide layer having a lower hydrogen concentration, e.g., SiOx, material layer, than the gate insulator for the LTPS TFT having a higher hydrogen concentration SiOx material layer or SiNx material layer, e.g., between 5 and 20 atomic percent.

Figure 15I:
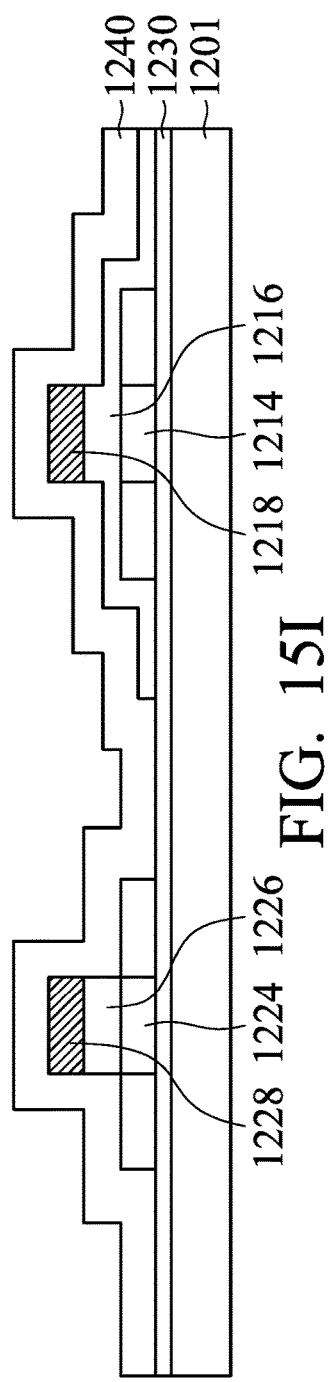

After disposing the gate insulators, the gate electrodes 1218, 1228 are deposited and patterned over the respective active layer in the LTPS TFT area and the IGZO TFT area, as illustrated in FIG. 15F, using a photoresist process. FIG. 15G then illustrates the doping of the impurities in the LTPS active layer to define the source and drain areas, e.g., regions, for the LTPS TFTs. As seen in FIG. 15H, the gate insulator in the IGZO TFT area can be thinned using a dry etching process, where the gate insulator can remain over the IGZO active layer in the IGZO TFT area, where the gate insulator has a greater thickness over a part of the active layer and a smaller thickness over the source and drain areas. The first interlayer dielectric layer 1240, which can comprise a SiNx layer, is then deposited and patterned over the gate insulators and gate electrodes, as illustrated in FIG. 15I.

Figure 15J:
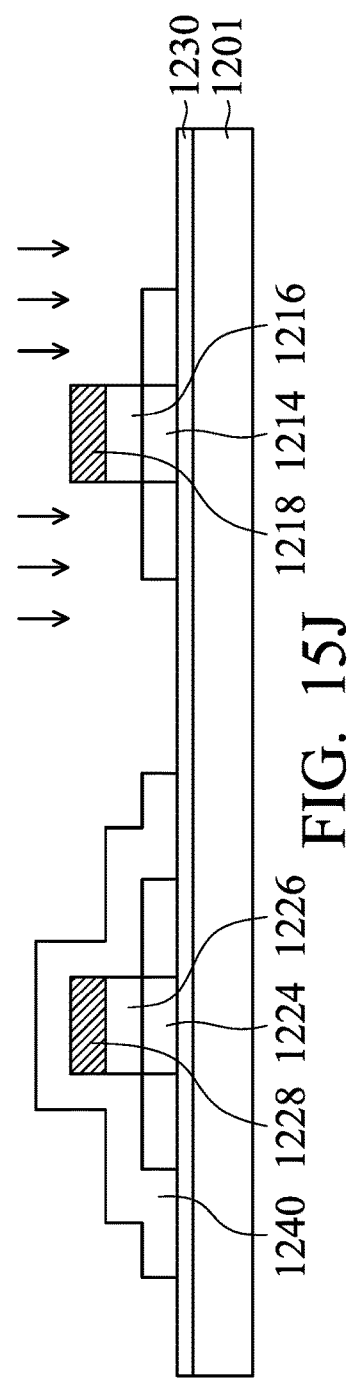
Figure 15K:
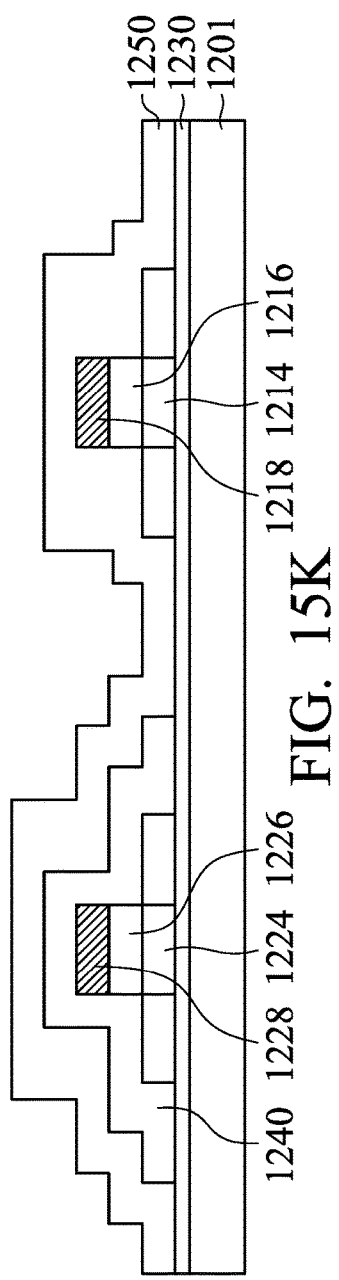

In a following step, as seen in FIG. 15J, the first interlayer dielectric layer 1240 comprising the SiNx layer is etched so that the interlayer dielectric layer is not included in the IGZO TFT area and may be disposed only over the LTPS TFT area. And, the gate insulator and gate electrode are still disposed above the IGZO active layer. The IGZO active layer is then plasma treated to form source and drain areas, e.g., to form an n-channel TFT. After which, as seen in FIG. 15K, the second interlayer dielectric layer 1250, which comprises a SiOx layer, can be deposited and patterned over the first interlayer dielectric layer, the LTPS TFT area, and the IGZO TFT .

Figure 15L:
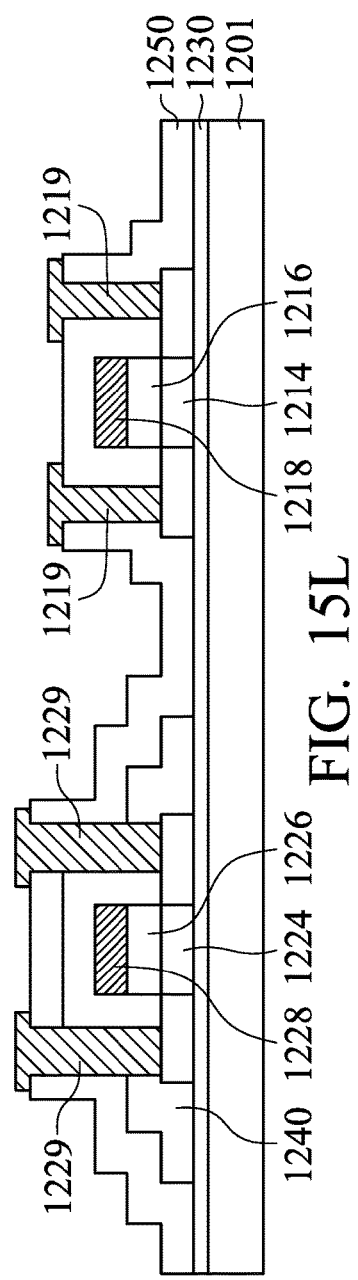

The source and drain electrodes are deposited and patterned for the LTPS TFT and the IGZO TFT, where the source and drain electrodes electrically connect to the source and drain areas through source/drain contact holes in the respective TFT, and the source/drain contact holes are formed in the second interlayer dielectric layer 1250, as seen in FIG. 15L. After the hybrid TFT structure 1200 is provided, a passivation layer 1275 and a pixel electrode 1295 can then be deposited and patterned over the source and drain electrodes and the interlayer dielectric layer, where contact holes are formed in the passivation layer 1275 to connect to the source and/or drain electrodes of the TFTs and the top electrodes, as seen in FIG. 15M. And in an embodiment, the material of the pixel electrode 1295 and the source/drain electrodes could be the same.

While the present disclosure has been described in detail as different embodiments with reference to the drawings, it is understood that the present disclosure can be formed or manufactured having different steps and features without changing the principle of the disclosure. Therefore, the disclosure is not to be limited by the description of exemplary embodiments of the disclosure, but only by the scope of the appended claims. For example, the steps for manufacturing the hybrid TFT structure so that the IGZO active layer contacts a SiOx layer is not limited to particular sequential steps for forming the hybrid TFT structure, but can be performed in any specific order or include features described and illustrated in other embodiments of the disclosure.

We claim:

1. A display device, comprising:
a substrate having a surface;
a first thin film transistor (TFT) on said substrate, said first thin film transistor comprising a first active layer, a first gate insulator, and a first gate electrode, wherein said first thin film transistor is adjacent to said surface;
a second thin film transistor (TFT) on said substrate, said second thin film transistor comprising a second active layer, a second gate insulator and a second gate electrode;
wherein said first gate insulator is disposed between said first gate electrode and said first active layer;
wherein a material of said first active layer is different from a material of said second active layer;
wherein a hydrogen concentration of said second gate insulator is different from a hydrogen concentration of said first gate insulator; and
a buffer layer disposed between said first active layer and said second active layer, wherein said second active layer, said buffer layer and said first active layer are sequentially disposed on said substrate along a direction perpendicular to said surface of said substrate, comprising:
a first sublayer disposed on said second active layer; and
a second sublayer disposed on said first sublayer,
wherein said second gate insulator is disposed between said second gate electrode and said second active layer, and disposed above the first sublayer.

2. The display device according to claim 1, wherein said material of said second active layer comprises metal oxide.

3. The display device according to claim 1, wherein said hydrogen concentration of said second gate insulator is less than or equal to 5 atomic percent and greater than or equal to 0 atomic percent.

4. The display device according to claim 3, wherein said hydrogen concentration of said first gate insulator is greater than 5 atomic percent and less than 10 atomic percent.

5. The display device according to claim 1, wherein a material of said first gate insulator comprises at least one of silicon oxide, silicon nitride, and silicon oxynitride, and a material of said second gate insulator comprises at least one of silicon oxide and silicon oxynitride.

6. The display device according to claim 1, wherein said first gate insulator and said second gate insulator overlap.

7. A display device, comprising:
a substrate having a surface;
a first thin film transistor (TFT) on said substrate, said first thin film transistor comprising a first active layer, a first gate insulator and a first gate electrode, wherein said first thin film transistor is adjacent to said surface;
a second thin film transistor (TFT) on said substrate, said second thin film transistor comprising a second active layer, a second gate insulator and a second gate electrode;
wherein said first gate insulator is disposed between said first gate electrode and said first active layer;
wherein a material of said first active layer is different from a material of said second active layer, and a material of said first gate insulator is different from a material of said second gate insulator;
wherein said material of said second active layer comprises metal oxide and said material of said second gate insulator comprises silicon oxide; and
a buffer layer disposed between said first active layer and said second active layer, wherein said second active layer, said buffer layer and said first active layer are sequentially disposed on said substrate along a direction perpendicular to said surface of said substrate, comprising:
a first sublayer disposed on said second active layer; and
a second sublayer disposed on said first sublayer,
wherein said second gate insulator is disposed between said second gate electrode and said second active layer, and disposed above the first sublayer.

8. The display device according to claim 7, wherein a hydrogen concentration of said second gate insulator is less than a hydrogen concentration of said first gate insulator.

9. The display device according to claim 8, wherein said hydrogen concentration of said second gate insulator is less than or equal to 5 atomic percent and greater than or equal to 0 atomic percent.

10. The display device according to claim 9, wherein said hydrogen concentration of said first gate insulator is greater than 5 atomic percent and less than 10 atomic percent.

11. The display device according to claim 7, further comprising a blanking layer disposed between said second active layer and said substrate.

12. The display device according to claim 7, wherein said second thin film transistor further comprises a third gate electrode, wherein said second gate electrode is disposed above said second active layer and said third gate electrode is disposed below said second active layer.

13. The display device according to claim 7, wherein said first gate insulator and said second gate insulator overlap.

* * * * *